United States Patent [19]

Gonzalez et al.

[11] Patent Number: 4,792,911
[45] Date of Patent: Dec. 20, 1988

[54] DIAGNOSTIC APPARATUS FOR AN ELECTRIC GENERATOR SEAL OIL SYSTEM

[75] Inventors: Avelino J. Gonzalez; Kurt H. Steinebronn; Michael J. Rasinski, all of Winter Springs; Owen R. Snuttjer, Oviedo, all of Fla.

[73] Assignee: Westinghouse Electric Corp., Pittsburgh, Pa.

[21] Appl. No.: 821,369

[22] Filed: Jan. 17, 1986

[51] Int. Cl.$^4$ ............................................. G06F 15/46
[52] U.S. Cl. ............................... 364/551.02; 371/20
[58] Field of Search ............... 364/492, 494, 550, 551, 364/557, 558; 371/20, 22; 377/19, 21; 137/495, 497, 498, 558; 340/612, 618, 679

[56] References Cited

U.S. PATENT DOCUMENTS

| | | | |
|---|---|---|---|
| 4,517,468 | 5/1985 | Kemper et al. | 364/492 |
| 4,523,286 | 6/1985 | Koga et al. | 364/494 |
| 4,635,214 | 1/1987 | Kasai et al. | 364/551 |
| 4,644,479 | 2/1987 | Kemper et al. | 364/492 |

Primary Examiner—Parshotam S. Lall
Assistant Examiner—Brian M. Mattson
Attorney, Agent, or Firm—D. Schron

[57] ABSTRACT

A conventional hydrogen-cooled electric generator having gland seals prevents the escape of hydrogen gas from the generator housing. A conventional seal oil system provides the gland seals with the necessary oil so as to perform their sealing function. Diagnostic apparatus is provided for the arrangement and includes a plurality of sensors which provide output signals indicative of certain parameters such as temperatures and pressures throughout the seal oil system. The output signals are provided to a diagnostic computer which, in a preferred embodiment, utilizes an expert system diagnostic routine for examining the sensor signals and deriving certain conclusions relative to the operating condition of the seal oil system. Various conclusions are additionally reached using operator-entered information from off-line sensors.

25 Claims, 21 Drawing Sheets

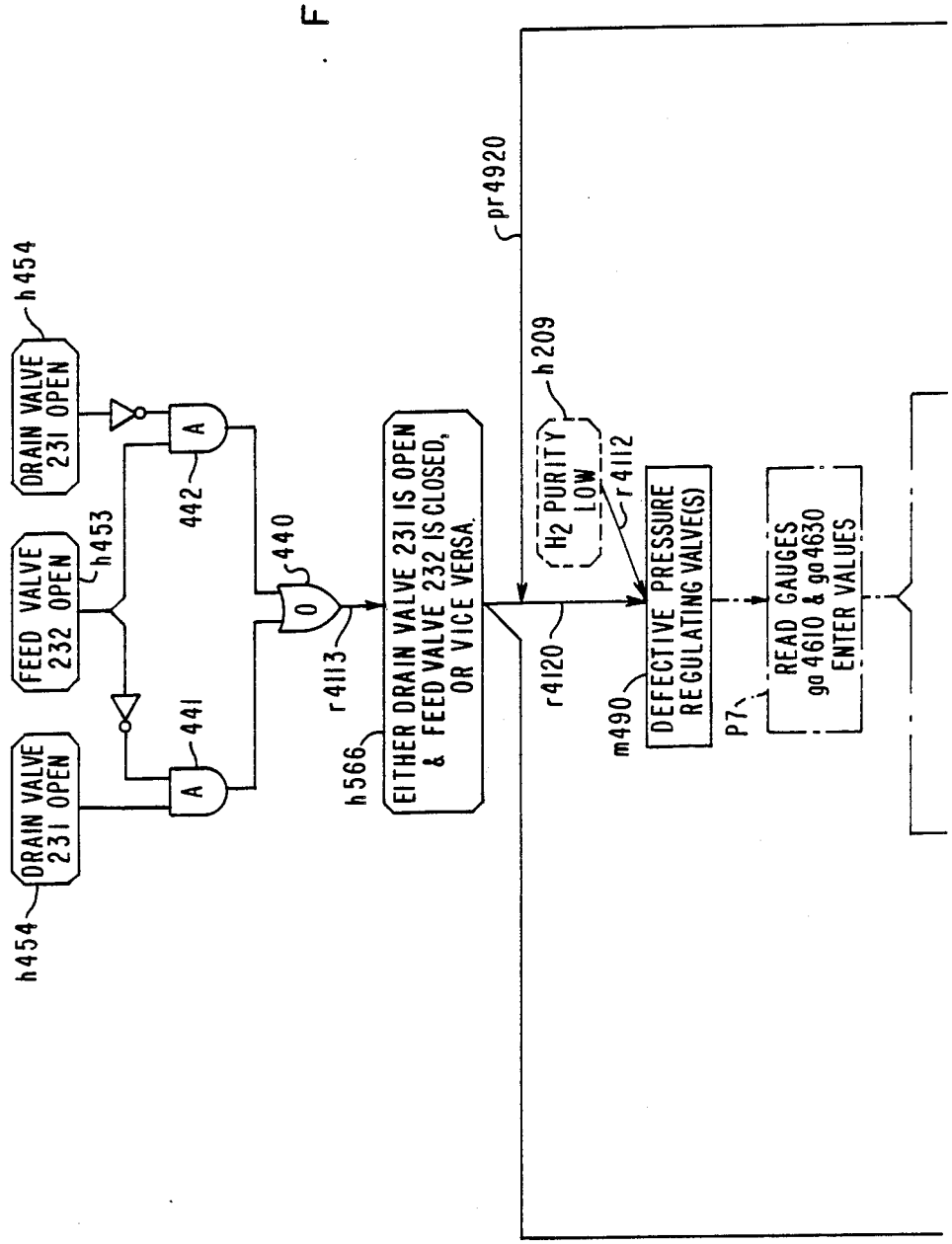

4,792,911

DIAGNOSTIC APPARATUS FOR AN ELECTRIC GENERATOR SEAL OIL SYSTEM

BACKGROUND OF THE INVENTION

1. Field of the Invention

The invention relates to an on-line diagnostic system for a seal oil system associated with a gas-cooled electric generator.

2. Description of the Prior Art

Modern electric generators such as those driven by steam turbines have the capacity to generate currents of thousands of amperes in their stator windings. Such arrangement also generates a large amount of unwanted heat due to stator and rotor winding resistance as well as windage losses. Accordingly, a cooling system must be provided in order to remove the heat resulting from the electrical and windage losses during normal operation.

One type of cooling system utilizes a flow of cooling gas, such as hydrogen, within the generator housing as well as within the rotor and stator structures to remove the produced heat.

The hydrogen cooling atmosphere must remain within the generator housing, and since the rotor shaft ends of the generator extend through the gas tight enclosure, provisions are made to prevent the escape of gas along the shaft. To this end, shaft seals, known as gland seals are provided. An auxiliary seal oil system supplies the gland seals with oil under pressure to prevent the escape of hydrogen gas from the generator as well as to provide lubrication to the gland seals.

The seal oil system includes seal oil pumps, coolers, filters and a multitude of valves and monitoring devices such as gauges and alarm switches. Proper operation of the seal oil system is maintained by an operator's visual inspection of the gauges. Audible alarms are provided for critical functions such as low seal oil pressure or abnormal oil levels, for example.

An abnormal gauge reading may occur at a time when the operator is not monitoring the gauges and an alarm signal may not indicate the basic problem leading up to the alarm. The present invention provides for on-line continuous monitoring of the seal oil system and can indicate to an operator possible abnormal conditions which may be developing so that corrective action, if any, may be taken at the incipient stage of a possible malfunction.

SUMMARY OF THE INVENTION

Diagnostic apparatus is provided for a seal oil system of the type described and includes a plurality of sensors for obtaining on-line indications of predetermined operating parameters associated with various components of the system. Diagnostic computer means is provided and is responsive to the sensor signals to diagnose various possible abnormal operating conditions of various portions of the system based upon a plurality of different sensor readings.

The diagnostic computer means preferably determines abnormal operating conditions utilizing an expert system computer program that uses knowledge representations and inference procedures to reach conclusions normally determined by a human expert. A rule base is established in the memory of the diagnostic computer means with the on-line sensor signals being utilized in the diagnostic procedure. In addition, means are provided for entering off-line operator generated values into the diagnostic computer means for use in the diagnostic process.

BRIEF DESCRIPTION OF THE DRAWINGS

FIGS. 7A, 7B, 8A, 8B, 9A, 9B, 10-14, 15A, 15B, 16A, 16B, 17A and 17B are rule base flow diagrams illustrating operation of the present invention.

DESCRIPTION OF THE PREFERRED EMBODIMENT

Figure 1:
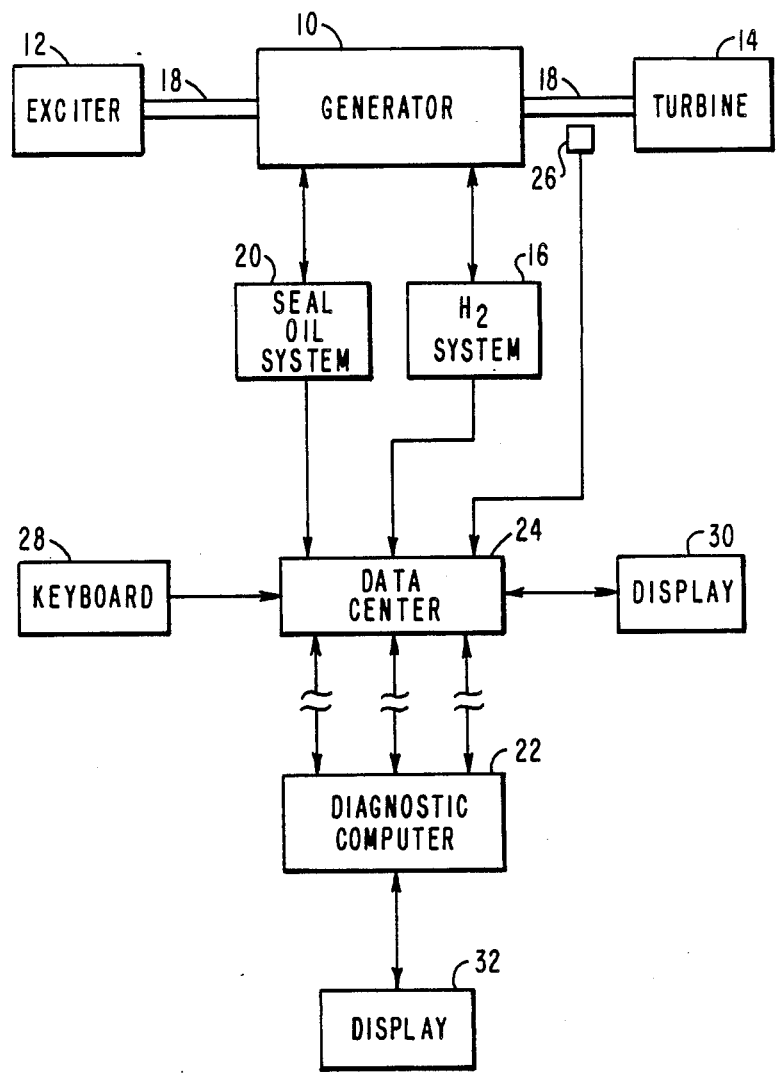
FIG. 1 is a simplified block diagram of a turbine-driven electric generator together with various monitoring and diagnostic systems.

FIG. 1 illustrates an electric generator 10 supplied with DC excitation current from exciter 12 and driven by a prime mover such as a steam turbine 14.

The generator is of the gas-cooled variety, hydrogen being a prime example, and accordingly a hydrogen auxiliary system 16 is provided for initial charging as well as subsequent make up of hydrogen and for maintaining and monitoring the hydrogen atmosphere in accordance with predetermined dryness, pressure and purity values.

When the generator 10 is not operating, but is filled with gas, or during normal operation with shaft 18 rotating, a seal oil system 20 provides oil under pressure to the gland seals to help keep gas from escaping from the generator and to lubricate the gland seals, as will be described.

In accordance with the present invention, the operation of the seal oil system is automatically monitored on-line. The operating condition of the seal oil system is thus provided to an operator who can initiate corrective action if the results of the diagnosis indicate the occurrence of one or more abnormal conditions. The diagnosis is performed by a diagnostic computer 22 which is provided with various sensor output readings from the operating system. In one embodiment, if the diagnostic computer 22 is resident at a location remote from the turbine generator power plant, the data gathered by the various sensors may be first supplied to a data center 24 for subsequent transmission to diagnostic computer 22, such as described in U.S. Pat. No. 4,517,468.

In addition to sensor information from the hydrogen and seal oil systems 16 and 20, an indication of turbine generator rotational speed may be provided by means of an RPM sensor arrangement 26. Operator-entered information may be placed into the data center by means of a keyboard 28 and an interactive display 30 allows for the display of local data as well as information transmitted back by the diagnostic computer 22. A display 32 at the remote location may include both visual and hard-copy records of the results of the diagnosis.

Although the diagnosis is applicable to a variety of different seal oil systems, it will be described by way of example with respect to a seal oil system wherein sealing oil is supplied to two axially displaced annular grooves in the gland seal, with the inner, or hydrogen side groove and the outer, or air side groove being provided with sealing oil from two respective separate supply systems. One such arrangement is illustrated in FIG. 2.

FIG. 2

Figure 2:
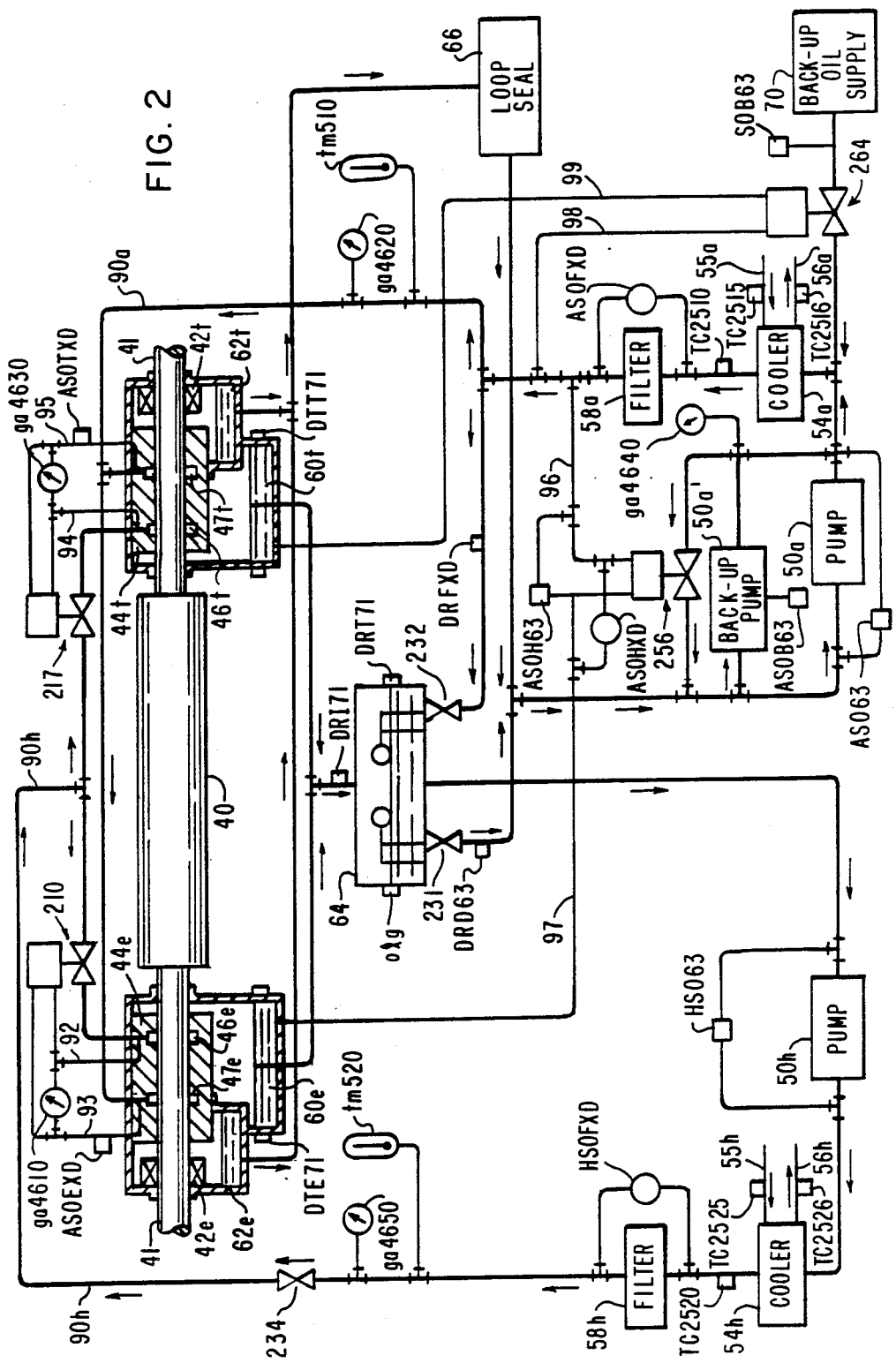
FIG. 2 is a simplified layout of one type of seal oil system.

FIG. 2 is a simplified representation of a seal oil system of the type described, and for clarity, various isolation, throttle, pressure relief and bleed valves have been omitted from the drawing. Generator rotor 40 is illustrated together with shaft 41, the left side of which is supported in a bearing 42e (e=exciter end) and the right side of which is supported in bearing 42t (t=turbine end). The shaft is surrounded by respective gland seals 44e and 44t each of which includes a respective inner or hydrogen side circumferential groove 46e and 46t, as well as an outer or air side circumferential groove 47e and 47t.

Sealing oil is supplied to the hydrogen side grooves 46e and 46t by means of a supply pump 50h (h=hydrogen side) while the air side circumferential grooves 47e and 47t are supplied with sealing oil from pump 50a (a=air side) having a normally off backup pump 50a' in parallel therewith.

The temperature of the oil supplied by pump 50h is controlled by means of cooler 54h having external water circulating input and output lines 55h and 56h. The cool oil is then passed through a filter 58h and a check valve 234 prior to delivery to the gland seals. In a similar manner, the air side arrangement includes cooler 54a and filter 58a.

Hydrogen side sealing oil from the gland seals is discharged into respective defoaming tanks 60e and 60t, while the air side discharge is collected in a combined bearing oil and seal oil drain 62e and 62t.

The hydrogen side sealing oil is maintained at a certain level within the defoaming tanks where most of the hydrogen entrained in the oil is removed and returned to the environment of the generator (the casing of which is not illustrated). Both defoaming tanks drain to a drain regulator 64 and then to the input side of pump 50h. The drain regulator functions to maintain the proper amount of oil in the hydrogen side of the seal oil system.

Oil from drains 62e and 62t is combined and provided to the input side of pump 50a after passage through a loop seal and vapor extraction assembly 66 which continuously vents any hydrogen in the line to the atmosphere.

Normal seal oil pressure is, for example, 12 psi higher than the gas presure. If the air side pump 50a should stop, or if the seal oil pressure at the gland seals should decrease to a predetermined value, for example, 8 psi above the hydrogen pressure, a backup oil supply 70 will be put into operation to provide the necessary oil pressure for the seals.

As long as the oil pressure in the circumferential grooves exceeds the hydrogen pressure in the generator, sealing oil will flow inward rather than permitting hydrogen to escape outward. When the oil pressures at the hydrogen side/air side interface on the shaft are equal, there will be no flow of oil in the clearance space between the two circumferential grooves.

FIG. 3

Figure 3:
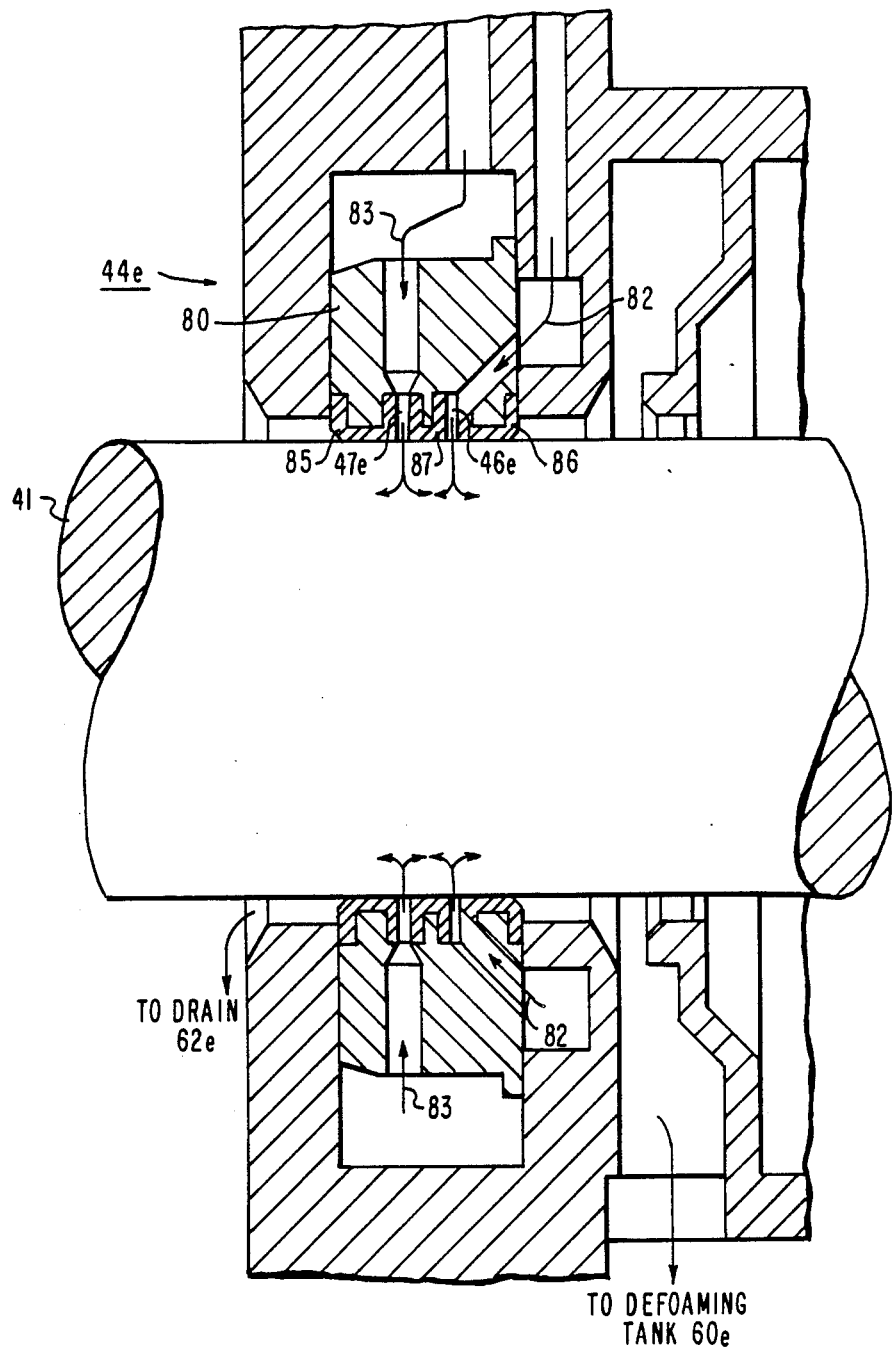
FIG. 3 is a cross-sectional view of a typical gland seal ring used in the seal oil system.

For example, and with additional reference to FIG. 3, there is illustrated, in somewhat more detail, a typical gland seal 44e. The gland seal includes a gland seal ring 80 having passages which terminate in circumferential grooves 46e and 47e. For some units the gland seal ring may be comprised of two distinct side by side structures, one for the hydrogen side and the other for the air side. As indicated by arrows 82, hydrogen side sealing oil is provided through passageways to groove 46e while arrows 83 indicate the passageway flow of air side oil to groove 47e. Oil supplied by the air side of the seal oil system flows outwardly along shaft 41 toward the bearing (not illustrated in FIG. 3). This helps to prevent release of absorbed air or moisture into the generator. Oil supplied by the hydrogen side of the system flows inwardly along the shaft toward the inside of the generator to help keep the air side seal oil from contacting the hydrogen and to assist in preventing the escape of absorbed hydrogen to the outside atmosphere. Oil emanating from both grooves 46e and 47e also flow toward one another however since the oil pressures are properly balanced, there is no interchange of oil supplies in the clearance space between the two circumferential grooves. As indicated on the Figure, the air side seal oil drains back to the bearing drain 62e and oil from the hydrogen side of the gland seal ring is provided to the defoaming tank 60e.

The surface of the seal ring adjacent the shaft 41 includes three babbits of a soft material which helps prevent damage to the shaft if sealing oil is lost. Babbit 85 is associated with the air side of the seal ring and babbit 86 is associated with the hydrogen side. Babbit 87 is shared by both sides.

Returning once again to FIG. 2, hydrogen side sealing oil supplied by pump 50h is provided to the gland seals by means of oil supply pipe 90h and the air side sealing oil from pump 50a is provided by means of oil supply pipe 90a (oil supply and return pipes are shown in heavy line). In order to balance the pressures between the two systems at the gland seals, there is provided a pressure equalizing valve 210. This valve senses the pressure of oil supplied to the hydrogen side and air side circumferential grooves 46e and 47e by means of respective sense lines 92 and 93 and throttles oil in line 90h until the pressures are equal. A similar pressure-equalizing valve 217 is provided for equalizing the pressures at gland seal 44t by virtue of sense line connections 94 and 95.

Other valves illustrated include float-operated drain valve 231, which opens if excess oil builds up in the drain regulator 64, and releases the excess oil to the air side oil input of pump 50a. Float operated fill valve 232 opens up if the drain regulator oil level is too low, and allows make up oil from the air side pump 50a to fill the tank to the correct level.

During operation, the oil pressure at the gland seals is maintained at a certain value, for example 12 psi above the hydrogen pressure. In order to maintain this relationship in pressures, there is provided differential pressure bypass regulator valve 256 connected to sense the air side oil pressure by means of sense line 96 and to sense the hydrogen pressure by means of sense line 97 connected to defoaming tank 60e. In response to the sensed pressures, valve 256 is operable to bypass the output of pump 50a to a greater or lesser degree so as to maintain the established 12 psi pressure differential. As previously described, the hydrogen side oil pressure will also be at a value equivalent to 12 psi above the hydrogen pressure since the hydrogen side and air side oil pressures are equalized by operation of valves 210 and 217.

Normally closed backup differential pressure regulator valve 264 functions to allow oil from the backup supply 70 to be provided to the seal oil system in the event of failure of pump 50a. Regulating valve 264 senses the pressure of the supplied air side oil by means of sense line 98 as well as the hydrogen pressure by means of sense line 99 connected to defoaming tank 60t. In a typical operation, valve 264 will open when the seal oil pressure decreases to, for example, 8 psi above the hydrogen pressure.

The arrangement of FIG. 2 includes a plurality of sensors and indicators utilized in the on-line diagnosis of the seal oil system. For easy reference, the sensors and indicators are set forth below in tabular form together with their particular function.

| | Pressure Switches |
|---|---|
| HSO63 | Connected across the hydrogen side seal oil pump 50h and closes when the differential pressure thereacross decreases to 5 psi. |
| ASO63 | Connected across the air side seal oil pump 50a and closes when the differential pressure thereacross decreases to 5 psi. |
| ASOB63 | Connected to backup pump 50a' and activates when the backup pump is put into operation. |
| SOB63 | Closes when the pressure from the backup oil supply 70 decreases to a certain value, for example 85 psi. |
| ASOH63 | Connected to sense lines 96 and 97 and closes when the oil pressure at the gland seals decreases to 5 psi above the hydrogen pressure. Closing also activates the backup pump 50a'. |
| DRD63 | Provides indication of flow in pipe connected to drain valve 231 of drain regulator 64. |
| | Pressure and Flow Transmitters |
| HSOFXD | Provides indication of differential pressure across filter 58h. |
| ASOFXD | Provides indication of differential pressure across filter 58a. |
| ASOHXD | Connected to sense lines 96 and 97 and indicates the difference between the seal oil and hydrogen pressures. |
| ASOEXD | Connected to sense line 93 and indicates the air side oil pressure at the exciter end. |
| ASOTXD | Connected to sense line 95 and indicates the air side oil pressure at the turbine end. |
| DRFXD | Indicates flow in pipe feeding valve 232 of drain regulator 64. |
| | Thermocouples |
| TC2510 | Provides indication of temperature of the air side oil after passage through cooler 54a. |
| TC2515 | Indicates temperature of input cooling water to cooler 54a. |
| TC2516 | Indicates temperature of output water from cooler 54a. |
| TC2520 | Provides indication of temperature of the hydrogen side oil after passage through cooler 54h. |
| TC2525 | Indicates temperature of input cooling water to cooler 54h. |
| TC2526 | Indicates temperature of output water from cooler 54h. |
| | Level Switches |
| DTE71 | Indicates high level of hydrogen side oil in defoaming tank 60e. |
| DTT71 | Indicates high level of hydrogen side oil in defoaming tank 60t. |
| DRT71 | Provides indication of low oil level in drain regulator 64. |
| DRI71 | Provides indication that oil is backing up in drain regulator 64. |
| | Gauges |
| ga4610 | Differential pressure gauge at exciter end. |
| ga4630 | Differential pressure gauge at turbine end. |
| ga4650 | Hydrogen side seal oil pressure gauge. |
| ga4620 | Air side seal oil pressure gauge. |
| ga4640 | Indicates pressure at output of air side pump 50a. |
| olg | Oil level gauge for drain regulator 64. |
| | Thermometers |
| tm520 | Shows temperature of hydrogen side seal oil. |
| tm510 | Shows temperature of air side seal oil. |

Except for the gauges and thermometers all of the above sensors provide on-line output indications to be used by the diagnostic computer 22 (FIG. 1) in the practice of the present invention.

The diagnostic computer 22 in a preferred embodiment controls the diagnostic process by implementation of an expert system computer program that uses knowledge representations and inference procedures to reach conclusions normally determined by a human expert. A common form of knowledge representation is in the form of IF . . . THEN rules. One such system which may be utilized in the practice of the present invention is PDS (Process Diagnosis System) described in the proceedings of the Eighth International Joint Conference on Artificial Intelligence, Aug. 8–12, 1983, pages 158–163. Basically, in that system (as well as other expert systems) for each rule there is an antecedent or evidence (the IF portion) as well as a consequent or hypothesis (the THEN portion) which can become evidence for other rules.

FIG. 4

Figure 4:
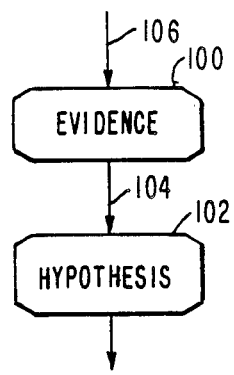
FIGS. 4 and 5 illustrate nodal diagrams utilized to explain one type of expert system which may be utilized in the operation of the present invention.

As depicted in FIG. 4, evidence 100 is linked to the consequent hypothesis 102 by means of rule 104, with the evidence and hypothesis constituting nodes of the system. Numeral 106 represents a supporting rule of node 100, that is, a rule for which node 100 would be a hypothesis. Rule 104 is a supported rule of node 100, that is, a rule for which node 100 is evidence. Likewise, rule 104 is a supporting rule for node 102. In the system, by way of example, nodes can take the form of evidence, hypothesis, malfunctions, sensors and storage-nodes which are nodes capable of storing values input from other nodes and performing some predetermined mathematical operation on the values. In the figures, hypothesis (or evidence) nodes are octagonal, abnormal conditions are presented in a malfunction node and are illustrated as rectangles, sensor nodes are circular and storage nodes are trapezoidal.

Associated with each node is a measure of belief, MB, that the node (hypothesis) is true, as well as a measure of disbelief, MD, which is a measure of belief that the hypothesis is not true. Both factors range on a scale from 0 to 1 and the difference between them, Mb−MD, yields a certainty or confidence factor CF which ranges from −1 to +1 where positive numbers respresent confidence that the hypothesis is true and negative numbers represent the belief that the hypothesis is not true; numbers in the vicinity of 0 represent uncertainty.

An expert (or experts) in the field to which the diagnosis pertains establishes the various rules and relationships, which are stored in the computer's memory and utilized in the diagnostic process. The expert's belief in the sufficiency of the rule is also utilized. This belief, which represents the expert's opinion as to how the presence of evidence proves the hypothesis, is given a numerical representation designated as a sufficiency factor, SF, which ranges from $-1$ to $+1$, where positive values of SF denote that the presence of the evidence suggests that the hypothesis is true and negative values denote that the presence of the evidence suggests that the hypothesis is not true.

PDS additionally utilizes the expert's belief in the necessity of the rule, which illustrates to what degree the presence of the evidence is necessary for the hypothesis to be true. This necessity belief is given a numeral representation designated as a necessity factor NF which ranges from $-1$ to $+1$, where positive values of NF denote that the absence of evidence suggests that the hypothesis is not true and negative values denote that the absence of the evidence suggests that the hypothesis is true.

FIG. 5

Figure 5:
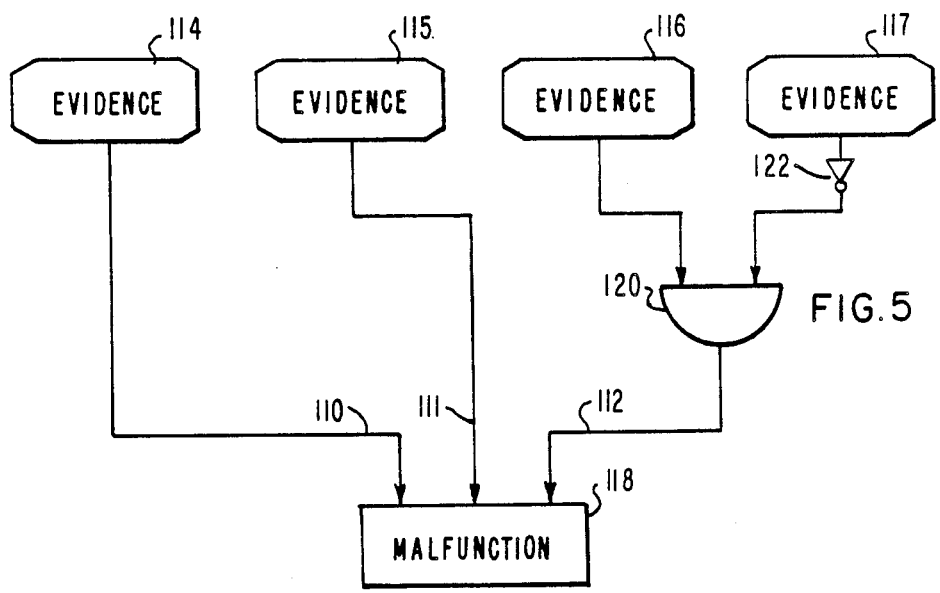

FIG. 5 illustrates another common arrangement wherein a plurality of rules 110 to 112 connect evidence nodes 114 to 117 to a malfunction node 118. Element 120 represents the combining of evidence in (a) a disjunctive manner, that is, if evidence 116 OR 117 is present, or (b) in a conjunctive manner, that is, if evidence 116 AND 117 are present. Numeral 122 designates a NOT function and where used (although not given a numerical designation in the Figs.) indicates that the evidence to which it is linked, is not present, that is, it indicates the converse of the evidence.

Belief leading to a consequent possible malfunction in the system being diagnosed is propagated from evidence to hypothesis in repetitive cycles, at the beginning of which the CF, MB and MD values of each node are reset to zero (except for a sensor node where the MB and accordingly the CF is assumed to be $+1$).

If the CF of the evidence is positive, then the rule's sufficiency is utilized to propagate belief, whereas if the CF of the evidence is negative, the rule's necessity is utilized; if CF is zero, nothing is done.

Basically, if the evidence CF is positive and the SF is positive, then the MB of the hypothesis is increased; if the SF is negative, then the MD of the hypothesis is increased.

Conversely, if the evidence CF is negative, and the NF positive, then the MD of the hypothesis is increased, and if the NF is negative, the MB of the hypothesis is increased. By way of example, for the single rule case of FIG. 4, if MB and MD are the belief and disbelief in the rule's hypothesis, CF the confidence in the rule's evidence, and SF and NF are the rule's sufficiency and necessity, then:

$$\begin{aligned} &\text{if } CF > 0 \text{ and } SF > 0: \\ &MB = CF \times SF \\ &MD \text{ is not changed} \end{aligned} \quad (1)$$

$$\begin{aligned} &\text{if } CF > 0 \text{ and } SF < 0: \\ &MD = CF \times (-SF) \\ &MB \text{ is not changed} \end{aligned} \quad (2)$$

$$\begin{aligned} &\text{if } CF < 0 \text{ and } NF > 0: \\ &MD = (-CF) \times NF \\ &MB \text{ is not changed} \end{aligned} \quad (3)$$

$$\begin{aligned} &\text{if } CF < 0 \text{ and } NF < 0: \\ &MB = CF \times NF \end{aligned} \quad (4)$$

MD is not changed

For the multiple rule case of FIG. 5, final values are obtained by examining each rule in sequence and performing the calculations for each rule in accordance with the following, where $MB_{old}$ and $MD_{old}$ are the belief and disbelief in the rule's hypothesis (malfunction) before each calculation, CF the confidence in the rule's evidence, SF and NF are the rule's sufficiency and necessity and $MB_{new}$ and $MD_{new}$ are the belief and disbelief in the rule's hypothesis (malfunction) after each calculation:

$$\begin{aligned} &\text{if } CF > 0 \text{ and } SF > 0: \\ &MB_{new} = MB_{old} + (1 - MB_{old}) \times CF \times SF \\ &MD_{new} = MD_{old} \end{aligned} \quad (5)$$

$$\begin{aligned} &\text{if } CF > 0 \text{ and } SF < 0: \\ &MD_{new} = MD_{old} + (1 - MD_{old}) \times CF \times (-SF) \\ &MB_{new} = MB_{old} \end{aligned} \quad (6)$$

$$\begin{aligned} &\text{if } CF < 0 \text{ and } NF > 0: \\ &MD_{new} = MD_{old} + (1 - MD_{old}) \times (-CF) \times NF \\ &MB_{new} = MB_{old} \end{aligned} \quad (7)$$

$$\begin{aligned} &\text{if } CF < 0 \text{ and } NF < 0: \\ &MB_{new} = MB_{old} + (1 - MB_{old}) \times CF \times NF \\ &MD_{new} = MD_{old} \end{aligned} \quad (8)$$

For a disjunctive logical node (OR function) the highest confidence factor of all of the pieces of evidence may be utilized or the CF may be obtained by subtracting the minimum MD from the maximum MB. If the logical node is conjunctive (AND function) the minimum of all of the confidence factors may be utilized or the CF may be obtained by subtracting the maximum MD from the minimum MB. Alternatively, weighted averages may be utilized for the OR and AND functions.

The AND and OR functions are not digital (ONE or ZERO) in nature and the logic utilized is known as fuzzy logic. Accordingly as utilized herein fuzzy logic AND and OR functions are designated with an A and O respectively whereas weighted AND and OR functions are designated with a horizontal bar and the appropriate letter designation.

Thus, by utilizing the appropriate previous equations, a measure of belief and/or disbelief is calculated for a hypothesis and from these values a confidence factor in the hypothesis is calculated from the relationship $CF = MB - MD$.

FIG. 6 (A and B)

Figure 6A:
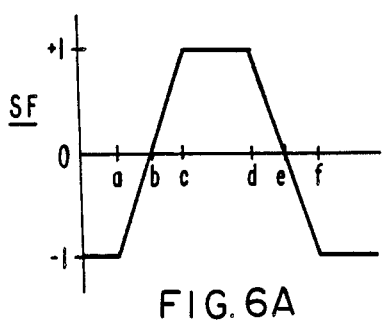
FIGS. 6A and 6B serve to illustrate typical functions which may be utilized in the expert system.
Figure 6B:
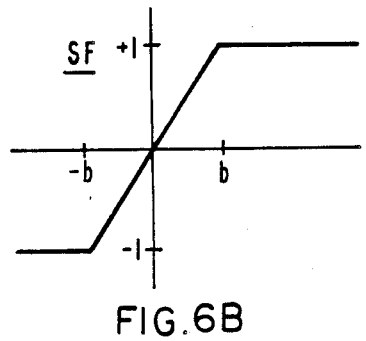

A rule's sufficiency (SF) or necessity (NF) may in many instances be expressed as a constant. In other instances, the sufficiency and/or necessity may be expressed as some other function which will generate a sufficiency or necessity factor of a fixed number by evaluating the function for a particular variable. A common function which may be utilized is a piece-wise linear function, two examples of which are illustrated in FIGS. 6A and 6B. The Y-axis in these figures represents the SF (or NF) ranging from $-1$ to $+1$ on the vertical scale. The X-axis horizontal scale represents the value of some variable such as a sensor reading or the result of some mathematical operation, by way of example. In FIG. 6A, if the variable has a value between 0 and a, or is greater than f, it will generate an SF of $-1$ whereas if the value is between c and d, it will generate an SF of +1. Values between a and c or d and f will generate corresponding SF's between −1 and +1.

FIG. 6B represents a piece-wise linear function wherein any variable value greater than b will generate an SF of +1, any variable value less than −b will generate an SF of −1 and values between −b and +b will generate a corresponding SF between −1 and +1.

Another type of useful rule is a reading-transform rule which, when carried out, applies a transform function to the value found in the rule's evidence node. If the evidence node is a sensor, the value is a sensor reading, with appropriate conversion, scaling, etc., performed by the transform if needed.

FIGS. 7–17 are nodal diagrams or rule base flow charts illustrating the diagnostic process of the present invention performed by diagnostic computer 22 for arriving at various seal oil system abnormal conditions based upon sensor readings, and implemented by way of example in accordance with the expert system previously described.

With respect to FIGS. 7–17, some of the hypotheses used in one figure may emanate from another figure and to provide some guide to the origin of an hypothesis, reference may be made to Appendix A. This Appendix sets forth in tabular form the hypothesis designation in numerical order, together with a brief explanation and the figure number where the hypothesis is first generated.

The diagnosis presented in FIGS. 7–17 relates to the seal oil system described by way of example in FIG. 2 and accordingly, additional reference should be made to FIG. 2.

FIGS. 7 (A and B)

FIG. 7 illustrates some possible abnormal conditions which may be diagnosed and which relate to the hydrogen side oil flow. One such condition is indicated at mode m400 designating to an operator a loss of pump action on the hydrogen side seal oil system. Normally this is indicated by activation of the pressure switch HSO63 connected across pump 50h. The output indication provided by HSO63 is also used in the present arrangement, however with additional supportive evidence leading up to the particular condition. The on-line sensor readings are automatically scanned and placed into sensor nodes of the expert system. Two such sensor nodes are illustrated in FIG. 7, and are respectively designated by their sensor names HSO63 and HSOFXD. Rule r400 relates the sensor condition of HSO63 into a belief that the hydrogen side seal oil pump 50h is off (or providing insufficient pressure) as set forth at node h400. Normally in the absence of any sensor abnormality, confidence in the hydrogen side pump being off may be propagated unaltered and used in the determination of loss of pump action as depicted in m400. In the presence of a sensor abnormality however the confidence must be reduced and one way of accomplishing this reduction is by a technique utilized in U.S. Pat. No. 4,644,479 and described in detail and claimed in U.S. Pat. No. 4,642,748.

Basically, the modification of the confidence is accomplished by a paralt (parametric alteration) rule which is operable to change the sufficiency function and/or necessity function of another rule. Accordingly, an analysis is made regarding the operability of switch HSO63. The analysis (to be subsequently described) may result in a determination of a faulty HSO63 switch (or its associated circuitry) as depicted at node m401 at the lower right portion of FIG. 7A. If indeed the switch is faulty, a paralt rule pr4 is generated to alter the sufficiency of rule r401 linking hypothesis h400 with hypothesis h409 indicating a validated conclusion regarding the hydrogen side pump being off. That is, in the absence of a faulty HSO63 switch the confidence in the hydrogen side pump being off is propagated unaltered to m400 whereas if there is a faulty switch the propagated confidence would be proportionately lower.

Figure 7A:
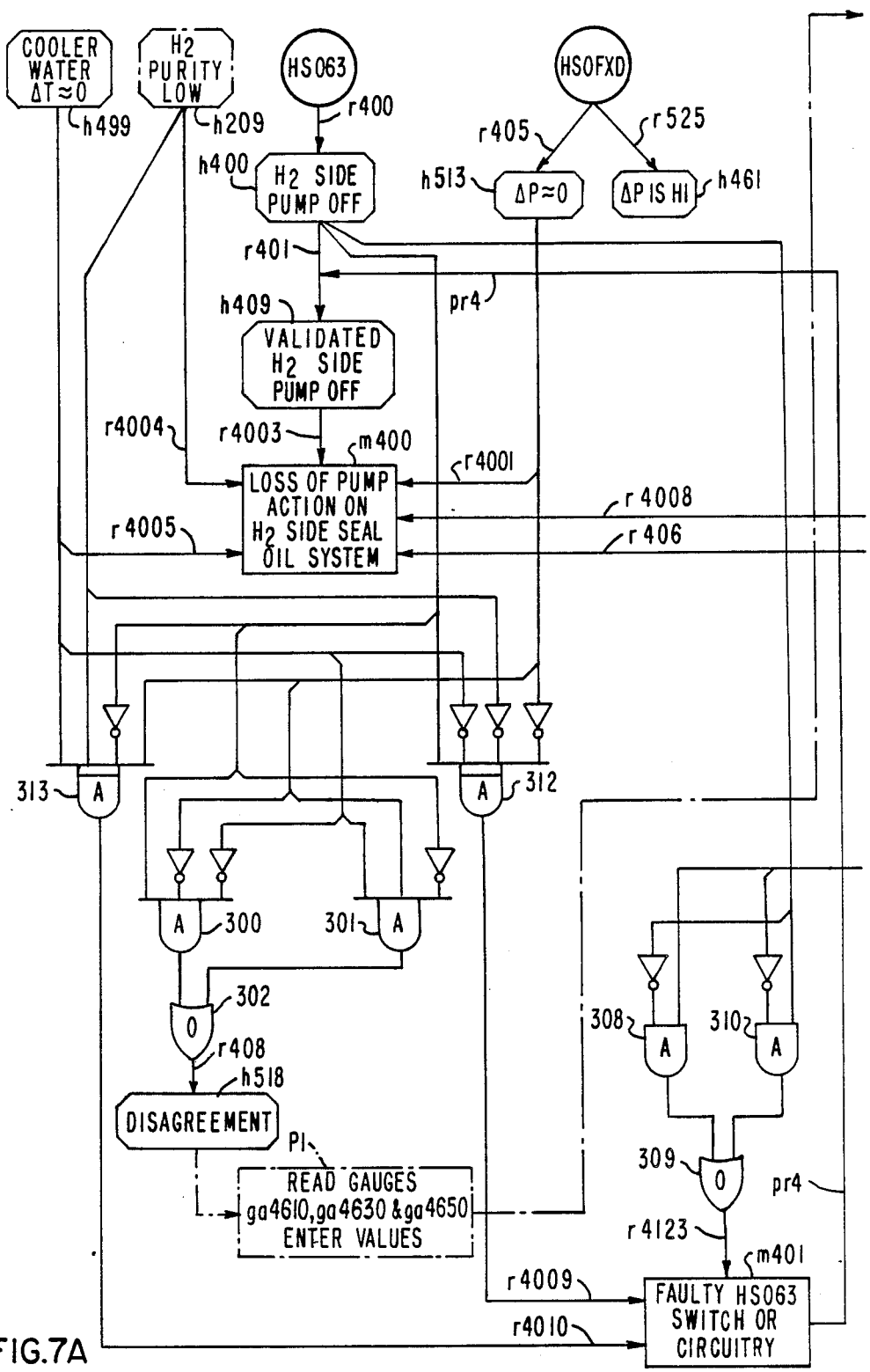

Additional evidence leading to the conclusion of the loss of pump action includes an hypothesis h499 at the upper left hand corner of FIG. 7A and stating that the cooler water differential temperature is approximately zero. In other words, if thermocouples TC2525 and TC2526 read substantially identical temperatures of the input and output cooling water to cooler 54h, then this is a good indication that hot oil is not being pumped since, if hot oil was being circulated by pump 50h, the cooling water would remove the heat and experience a rise in temperature. This condition is linked to m400 by means of rule r4005.

Sensor readings from the hydrogen system 16 (FIG. 1) may also be utilized in the diagnosis of the seal oil system 20. Hypotheses generated in the hydrogen system and utilized in the seal oil system diagnosis are shown in the Figures in dotted form, one of which is h209 stating that the hydrogen purity is low, a condition which may be caused by lack of pumping action allowing air side oil into the defoaming tanks from which air enters the generator atmosphere and degrades the hydrogen purity thereof.

Although these two latter conditions, low hydrogen purity and cooler water differential temperature being zero contribute additional belief to the loss of pump action, their contribution would not be as great as the validated hydrogen side pump being off conclusion of node h409. Accordingly, the sufficiency factors of rules r4005 and r4004 linking nodes h499 and h209 to node m400 would not be as great as the sufficiency factor for rule r4003 linking node h409.

Another observation lending more credence to the loss of pump action conclusion may be derived from sensor HSOFXD across filter 58h. If the pump is not working there is no oil flow and accordingly there would be no pressure drop across the filter. Rule r405 converts the sensor reading into a belief that the differential pressure across the filter is nearly zero as indicated at node h513. Although not illustrated, this ΔP determination may be validated by an independent check on sensor HSOFXD generating a paralt rule to modify the sufficiency and/or necessity of rule r4001 linking h513 with the conclusion depicted at m400.

Rule r408 at the lower left portion of FIG. 7A establishes that a difference exists between certain derived indications, and utilizes a plurality of logic functions 300 to 302. Basically, rule r408 may be traced back via AND functions 300 and 301 to hypotheses h400, h513 and h499. As depicted at AND 300 if the hydrogen side pump is indicated as being off and the differential pressure is not zero (it should be zero if the pump is off) and the cooler water differential temperature is not zero (it should be zero if the pump is off) or conversely as depicted at AND 301 if the cooler water differential pressure is zero and the differential pressure across the filter is zero but the hydrogen side pump is indicated as not being off then rule r408 establishes that a disagreement exists as depicted at node h518. In accordance with the present invention if this disagreement does exist then off-line readings are additionally used in the diagnostic process, such off-line procedures being indicated in the Figures by means of the dot-dash lines.

With the occurrence of this disagreement indication, a message is provided to the operator, as indicated by procedure P1 to read gauges ga4610, ga4630 and ga4650 and to enter their values into the system. This is accomplished with the provision of keyboard 28. Once inputted, the values read are placed into the respective sensor nodes ga4610, ga4630 and ga4650 illustrated in FIG. 7B. Storage node stn419 receives the gauge ga4650 reading via a reading transform rt432 and receives an indication of hydrogen pressure by means of reading transform rt433 from a sensor HYDXD located in the hydrogen system. The storage node operates to take the difference in the two readings and, via rule r409 relates this difference into a belief that the oil pressure is approximately equal to the gas pressure, as depicted at node h403. If pump 50h is off and with check valve 234 downstream of gauge 4650, the pressure indicated by this gauge would be the hydrogen gas pressure existing in drain regulator 64.

The other two gauge readings in sensor nodes ga4610 and ga4630 are utilized to determine if the air side oil pressure at the exciter end as well as at the turbine end is high. These two differential gauges should normally read approximately zero. If the hydrogen side pump 50h is off there is reduced oil pressure in the hydrogen side oil delivery pipe 90h and the air side pump 50a is supplying all of the sealing oil to both the air side and hydrogen side groves resulting in a significant differential pressure due to the higher air side oil pressure. The determination of high air side oil pressure is accomplished with the provision of rule r402 which may be a piece-wise linear mapping the particular reading into a determination of high air side pressure, at node h401, associated with the exciter end. Similarly, rule r403 links the sensor reading of ga4630 with hypothesis h402 indicative of a high air side pressure at the turbine end. These two conditions are utilized by rule r512 including AND function 304 to determine, at node h460 that high air pressure exists at both the exciter and turbine ends. This latter condition as well as the previously described condition that the oil pressure is approximately equal to the gas pressure are both linked to the loss of pump action node m400 by means of respective rules r4008 and r406 and in all probability, depending upon the quality of the gauges, would have relatively high sufficiency factors in determining the abnormal condition at node m400.

The off-line readings are also used to assist in the determination that a faulty HSO63 switch exists as previously set forth at node m401. For example, rule r4122 utilizes AND function 306 to determine that the hydrogen side pump is off according to off-line sensors, as set forth at node h567. In other words, this conclusion is reached if according to node h460 both the exciter and turbine ends have high air pressure, and the oil pressure is approximately equal to the gas pressure as concluded at node h403.

Rule r4123 utilizes the conclusion of h567 as well as h400 in a logical determination which states that if the pump is off according to off-line sensors and it is not off according to switch HSO63 (AND 308), or (OR 309) if the pump is off according to HSO63 but not off according to the off-line sensors (AND 310) then chances are that a faulty HSO63 switch exists.

Two other pieces of evidence are utilized in arriving at this conclusion, one of which is propagated by rule r4009 and the other by rule r4010. Rule r4009 utilizes a weighted AND function 312 which combines the evidence that the pump is off according to HSO63 coupled with the fact that the cooler water temperature differential is not zero, the hydrogen purity is not low and the differential pressure across the filter is not zero. If these three latter conditions exist then the pump should not be indicated as being off and accordingly the switch is probably bad.

Rule r4010 utilizes weighted AND function 313 which merely reverses the consideration of weighted AND 312.

The off-line sensor readings of gauges ga4610 and ga4630 may additionally be used to diagnose other potential problems. For example, rule r4016 in FIG. 7B utilizes AND function 316 to determine that, if there is high air side pressure at the exciter end but the high air side pressure does not exist at both the exciter and turbine ends, then in all probability the problem is in the exciter end, as depicted at node h520. If there is a problem in the exciter end and if the drain valve 321 is opened as depicted at node h454 then rule r4018 using AND function 318 arrives at the conclusion depicted at node m477 that there is ring wear on the exciter end of the hydrogen side seal oil ring since with a bad ring more oil than normal will be drained into the drain regulator resulting in float operated drain valve 231 being opened. If however, drain valve 231 is not open then in all probability differential pressure valve 210 is in a closed condition as set forth at mode m443 and determined by rule r4019 utilizing AND function 319.

FIGS. 8 (A and B)

Figure 7B:
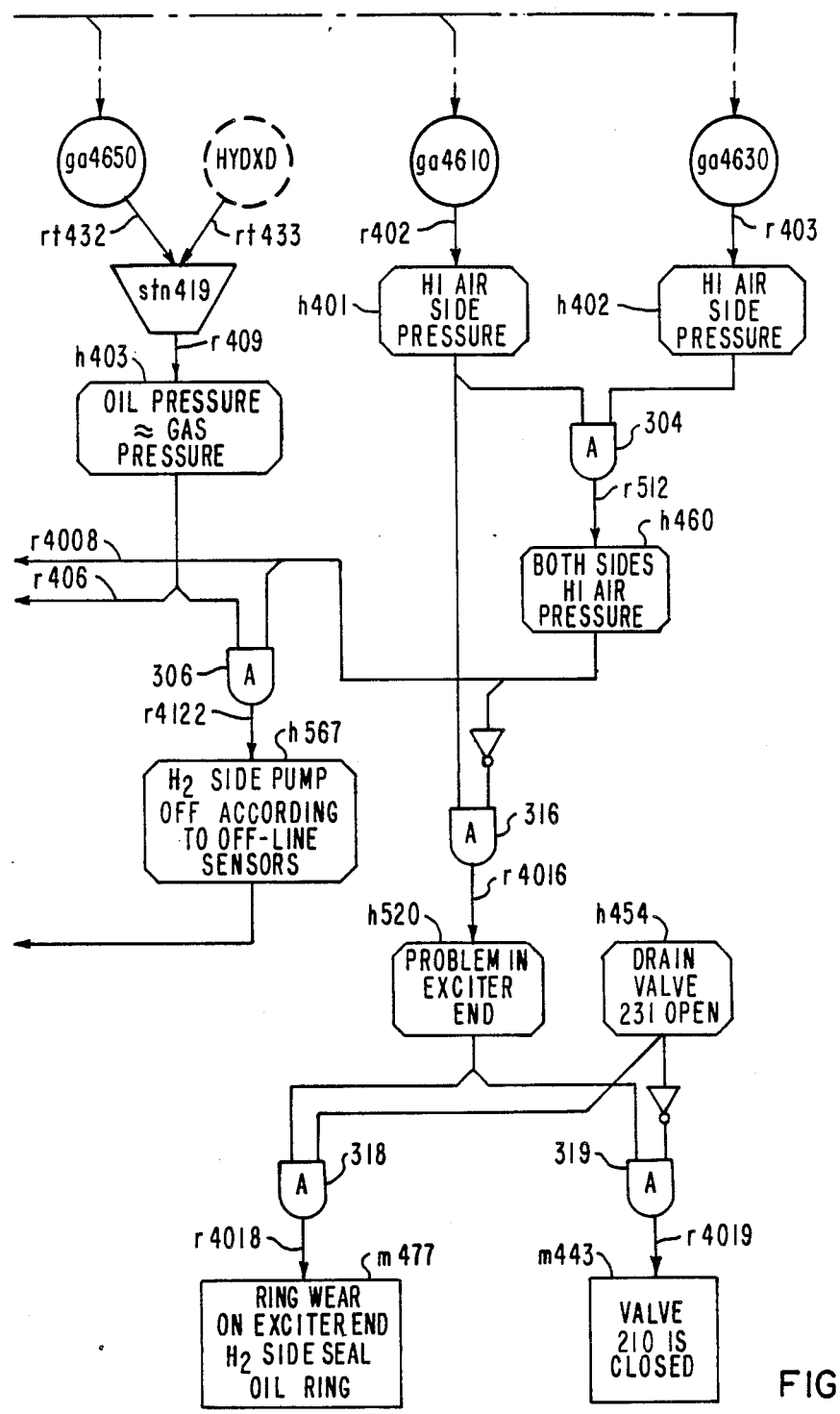
Figure 8A:
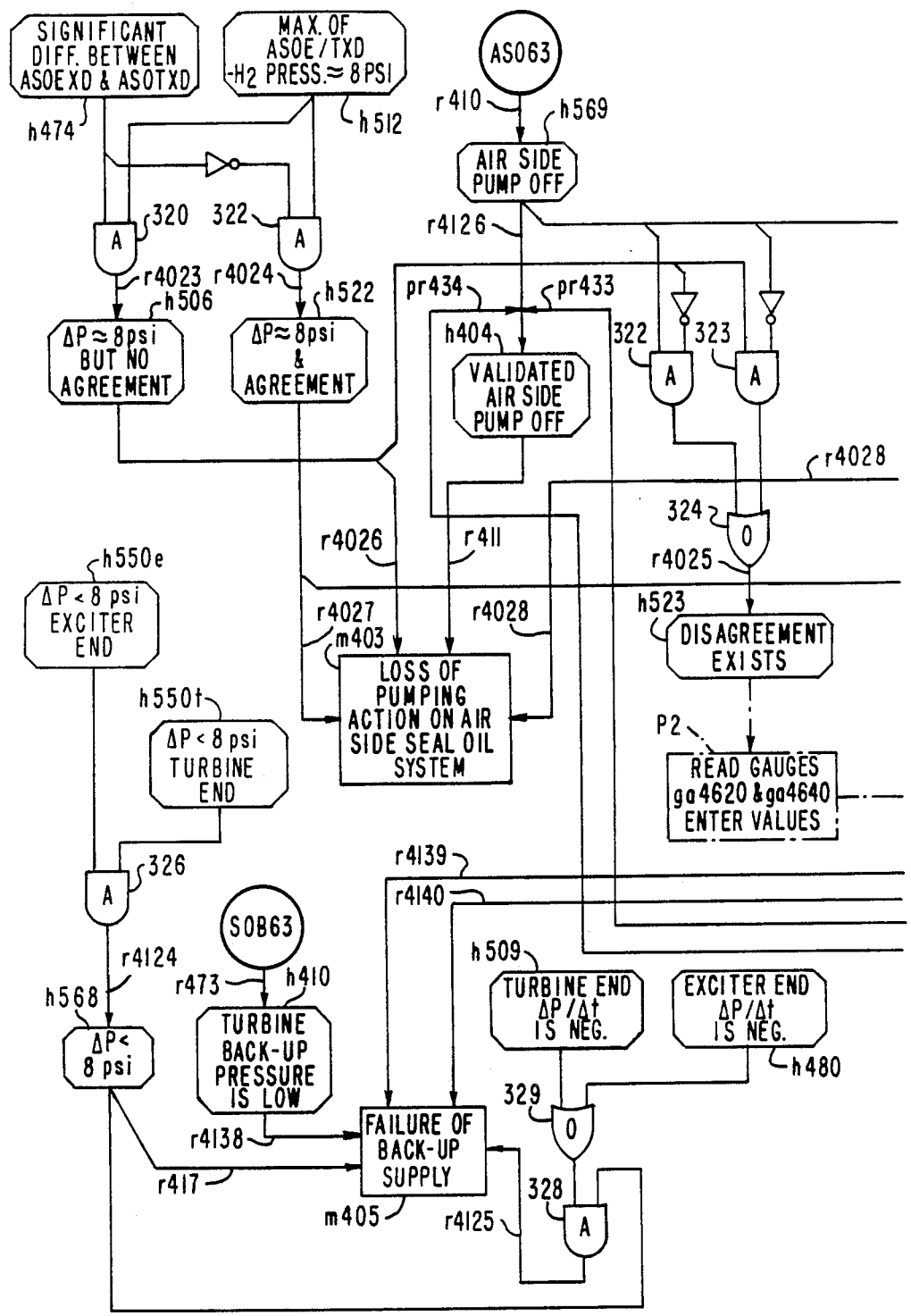
Figure 8B:
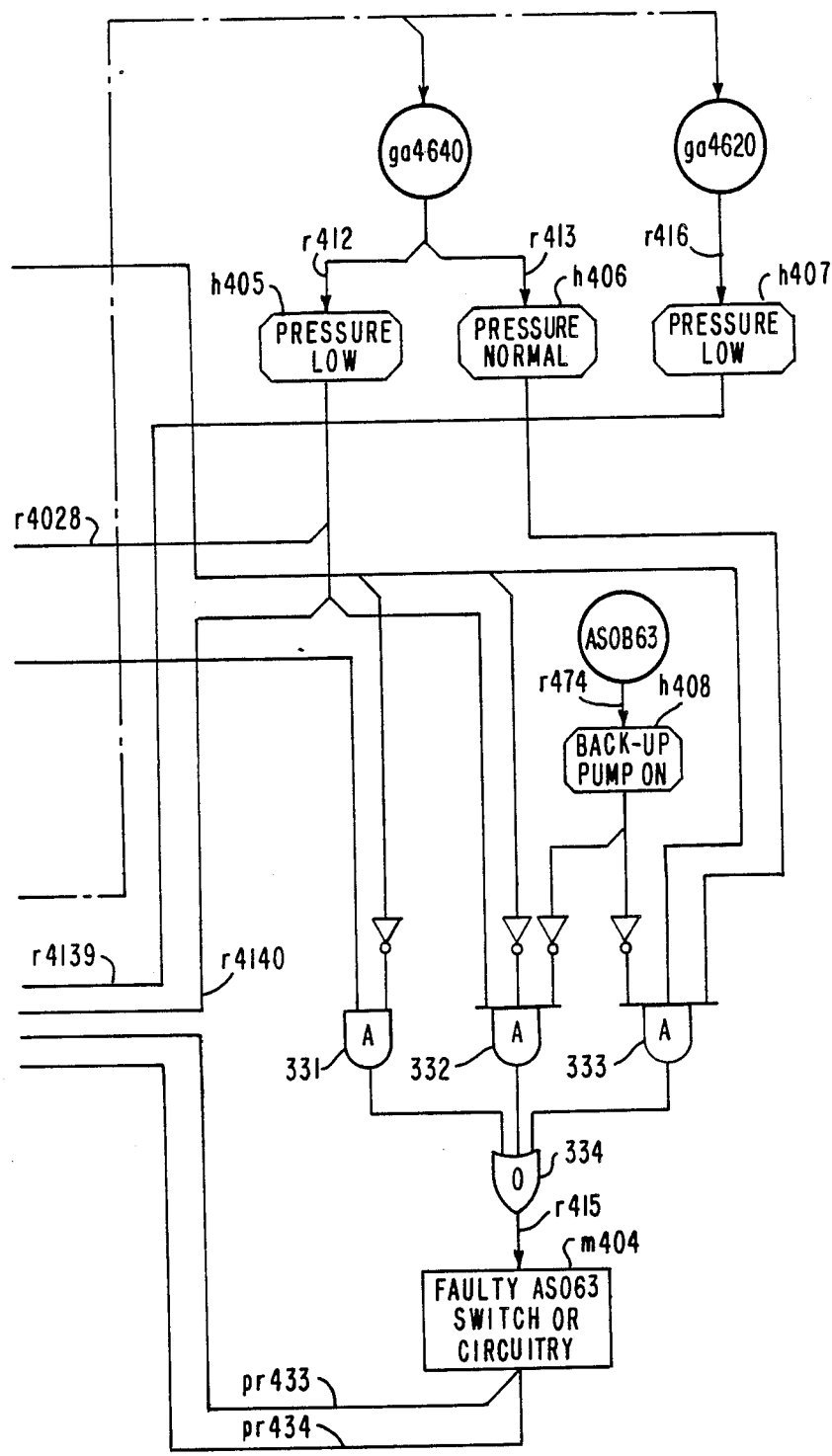

FIGS. 7A and 7B illustrated the diagnostic process to arrive at various possible abnormal conditions relative to the hydrogen side oil flow. FIGS. 8A and 8B illustrate by way of example, various abnormal conditions that may be diagnosed with respect to the air side oil flow. The on-line condition of pressure switch ASO63 connected across air side pump 58a is placed into sensor node ASO63 in FIG. 8A and rule r410 converts the condition of the switch into a belief that the air side pump is off, as depicted at node h569. Rule r4126 may have its sufficiency and necessity changed by paralt rules pr434 and pr433 to arrive at a validated conclusion, at node h404 that the air side pump is needed off.

This belief is linked by rule r411 to the conclusion, at node m403 that there is a loss of pumping action on the air side seal oil system, which, in addition to the belief of h404 also uses other evidence to arrive at this conclusion. For example, the air side seal oil pump will deliver oil at a pressure which is approximately 12 psi above the hydrogen gas pressure. If pumping action should stop, the backup oil supply 70 will come on line, however, the oil delivered by the backup supply is at a pressure somewhat lower than that normally supplied by the air side pump. One clue therefore regarding loss of air side pumping action is the existence of a differential pressure of 8 psi between the air side oil pressure and the hydrogen pressure, as opposed to the normal 12 psi difference.

The two sensors for determining air side oil pressure are ASOEXD at the exciter end and ASOTXD at the turbine end. A determination is made (FIG. 12) as to whether or not these values agree and the results are utilized in the diagnostic procedure of FIG. 8A at node h474 in the upper left hand corner thereof. In addition, the maximum pressure indicated by these two sensors is utilized and compared with the hydrogen pressure to see if the difference is approximately 8 psi, and this will be indicated at node h512.

Rule r4023 utilizing AND function 320 checks to see whether or not the sensors agree, from h474, and whether the differential pressure is 8 psi, from h512, to arrive at the conclusion that the differential pressure is 8 psi but there is no sensor reading agreement, as depicted at node h506 and linked to the loss of pumping action node m403 by rule r4026. If the 8 psi differential exists and there is agreement between the two sensors, rule r4024 utilizing AND 322 relates the two beliefs into a conclusion, at node h522 that the differential pressure is 8 psi and there is agreement between the two sensors, this conclusion being linked to node m403 by means of rule r4027 and adding somewhat more confidence to the conclusion than would rule r4026.

If the air side pump happens to be off and the conclusion of node h506 is not present or if it is present and the air side pump happens to be on, then rule r4025 utilizes this information to arrive at the conclusion, utilizing AND and OR functions 322 to 324, that a disagreement exists, as set forth at node h523 prompting a procedure P2 wherein the operator is to read gauges ga4620 and ga4640 and to enter their present values via the keyboard. These values are used in the diagnostic process by placement into sensor nodes ga4620 and ga4640 seen in FIG. 8B.

Rules r412 and r413 utilize respective piece-wise linear functions to map the reading of ga4640 into a belief that the pressure is either low or that the pressure is normal as presented at respective nodes h405 and h406. Normal pump pressure for example may be in the range of 130 to 150 psi whereas a low pressure may be any pressure below 120 psi. Pressures outside of the stated values would generate sufficiency factors other than 1 in accordance with the piece-wise linear functions utilized.

Since there normally is a pressure drop across the cooler and filter, gauge ga4620 will normally indicate a lower pressure such that the low pressure indication at node h407 may be indicative of a pressure below 100 psi, as determined by rule r416.

The low pressure indication at node h405 is utilized, by rule r4028 as another piece of evidence leading to the conclusion of a loss of pumping action, at node m403. The low pressure indication is also utilized by rule r4140 as one piece of evidence indicating a failure of the backup oil supply, set forth at node m405 which also utilizes the low pressure indication of node h407 linked by rule r4139.

Another indication of the failure of the backup supply is the presence of low turbine backup pressure, propagated by rule r4138 and indicated at node h410 and determined utilizing rule r473 which propagates the condition of the backup pressure switch SOB63.

A fourth indication of backup source failure may be provided by an indication that the differential pressure is below what it should be, that is, 8 psi. Rule r4124 utilizing AND function 326 examines the evidence presented by hypotheses h550e and h550t, which state that the air side exciter end and air side turbine end sensor values minus the hydrogen pressure result in a differential pressure of less than 8 psi. If these two conditions exist, then the conclusion of node h568 is established, that is, the differential pressure is less than 8 psi, this being linked to node m405 by rule r417.

The conclusion of h568 is additionally used in rule r4125 as another consideration for backup source failure. Rule r4125 includes an AND function 328 as well an OR function 329 such that if the turbine end differential pressure indicates a negative rate of change (h509) or if the exciter end differential pressure indicates a negative rate of change (h480) that is, the differential pressure is decreasing, then a backup source failure is indicated if the differential pressure is less than 8 psi.

As previously described, the air side pump off condition of node h569 is validated at node h404 in accordance with paralt rules pr433 and pr434. The propagation in the belief of the air side pump being off may be terminated if the pressure switch ASO63 is in fact faulty, with this determination being made at node m404 in the lower portion of FIG. 8B. To arrive at the conclusion of a faulty switch, rule r415 takes into account various pieces of evidence utilizing AND functions 331 to 333 and OR function 334.

For example, examining the considerations of AND function 331, a faulty switch may be indicated if the air side-to-hydrogen pressure differential is approximately 8 psi, with agreement between exciter end and turbine end pressure sensors and if the air side pump is not off. AND function 332 considers the existence of a low gauge pressure, from node h405, coupled with the pump not being off, from node h569, together with the backup pump not being on. This latter determination at node h408 utilizes the backup pump pressure switch ASOB63 indication together with rule r474. That is, if the main pump is on the pressure should not be low.

AND function 333 similarly examines inconsistencies such as the backup pump as well as the air side pump both being off, coupled with the gauge pressure being normal, derived from node h406. That is, if both pumps are off, then the pressure cannot be normal and accordingly a faulty ASO63 switch is assumed.

FIGS. 9 (A and B)

Figure 9A:
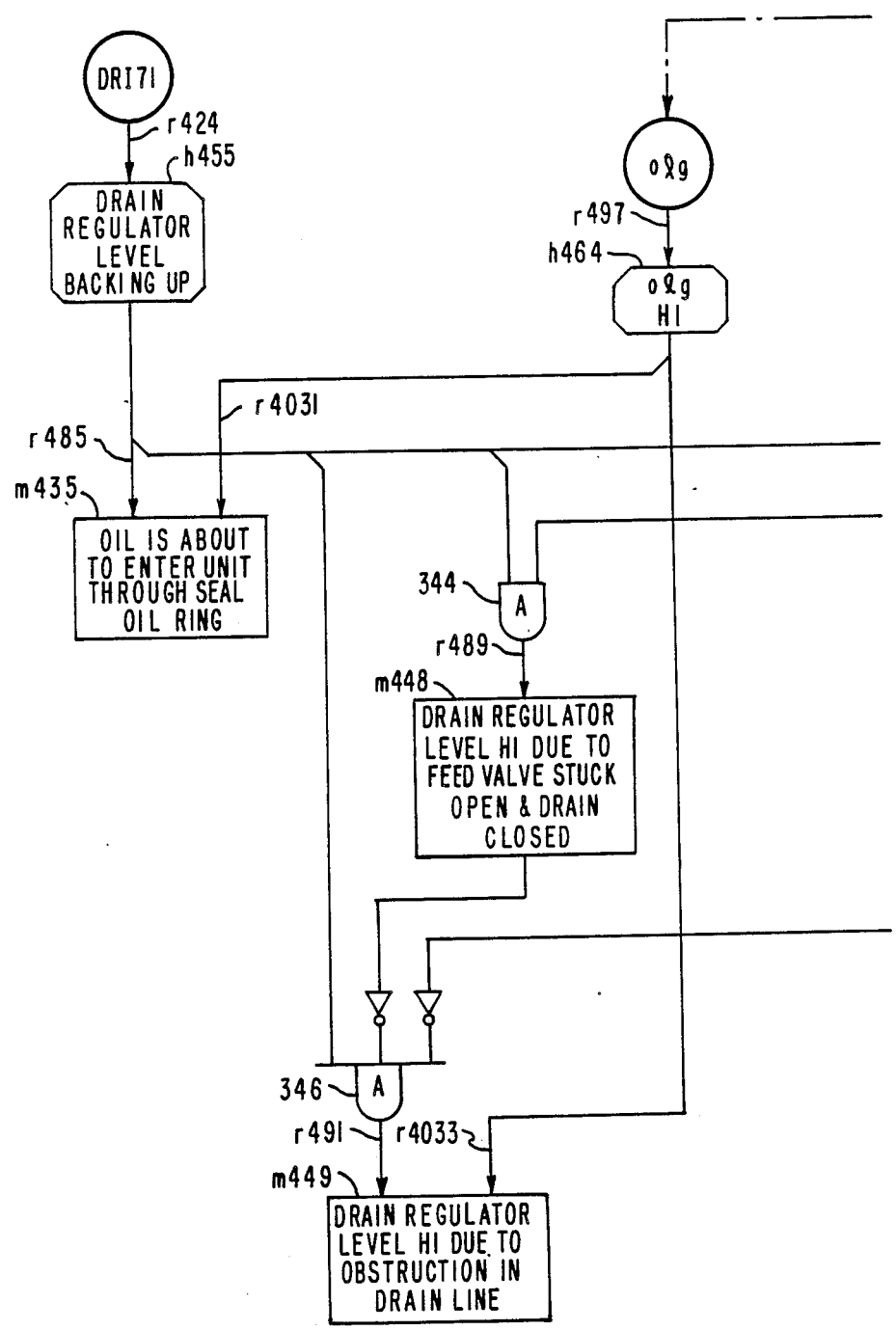
Figure 9B:
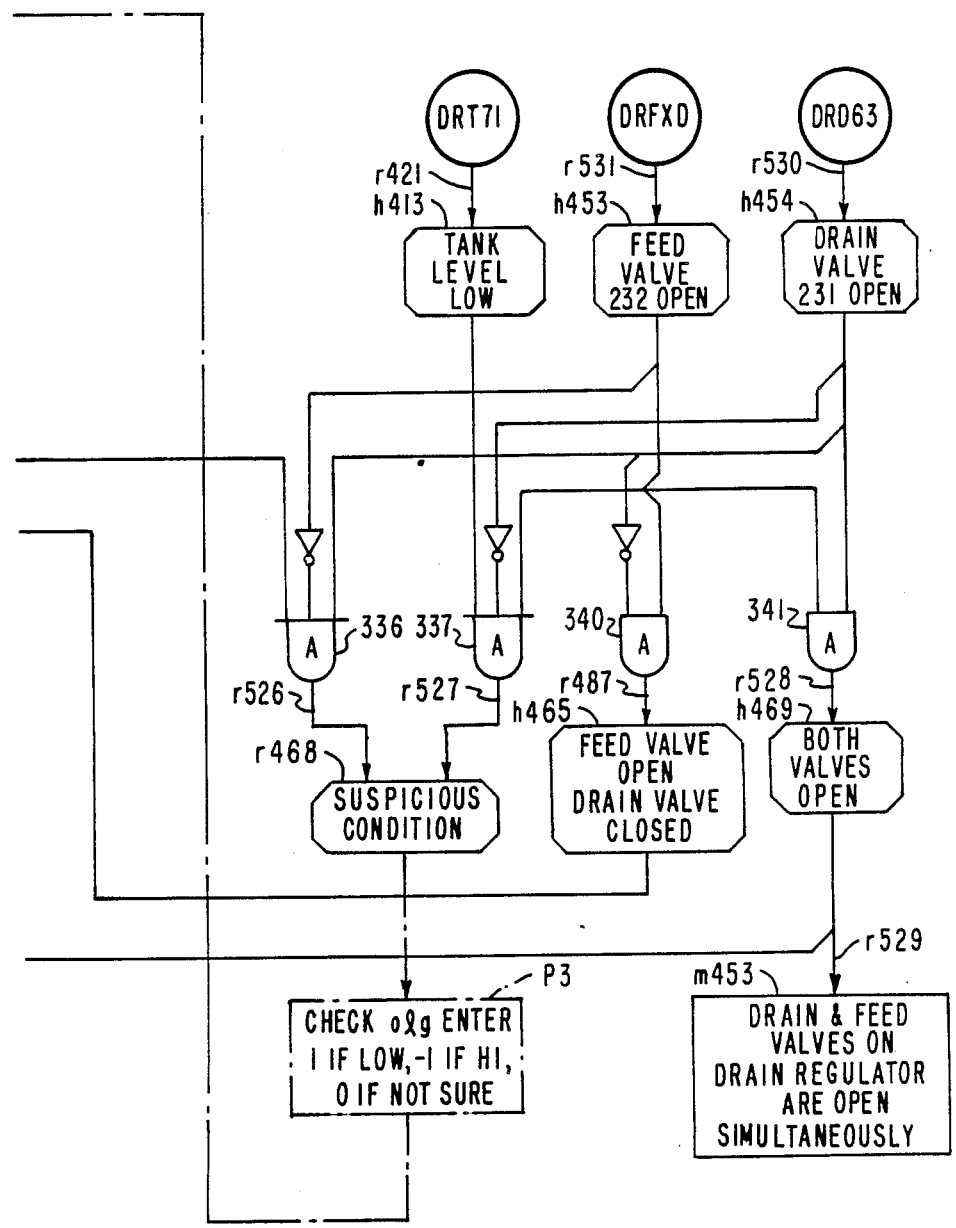

FIGS. 9A and 9B depict some abnormal conditions which may be associated with the drain regulator 64. Sensor node DRI71 contains the condition of this switch, leading to the belief via rule r424 that, if the switch is activated, the drain regulator tank level is backing up, as set forth at node h455. If the generator unit is off-line, rule r485 examines the evidence of the tank level backing up and arrives at the conclusion, at node m435 that oil is about to enter the generator unit through the seal oil ring. Other evidence supporting this conclusion is an off-line indication, to be described, provided by rule r4031 linked to the hypothesis at node h464 that the oil level gauge olg indicates a high level condition.

FIG. 9B illustrates rules r530 and r531 which convert the switch indication of sensor node DRD63 and flow indication of sensor node DRFXD into respective beliefs that the drain valve 231 is open, node h454, and that the feed valve 232 is open, node h453.

By means of AND function 336, rule r526 examines the valve conditions and if the drain valve 231 is indicated as being open while the feed valve 232 is indicated as being closed, coupled with a high tank level indication from node h455, then a suspicious condition exists as depicted at node h468 since the oil should be draining from the tank and therefore not backing up.

Similarly a suspicious condition is indicated by rule r527 utilizing AND function 337 which is presented with evidence that the feed valve 232 is opened, drain valve 231 is closed and the tank level is low, this latter evidence being provided by node h413 coupled by rule r421 to sensor node DRT71.

The presence of a suspicious condition as indicated at node h468 will serve to instruct the operator in accordance with procedure P3 to read gauge olg and enter the value of 1 if it indicates a low condition, a −1 if a high condition is indicated, or a zero if the condition is not certain. Rule r497 utilizing a piece-wise linear function then converts the reading to the belief that the olg is high. Of course if a 1 was entered at node olg, the confidence in a high olg at node h464 would be negative, indicating that the hypothesis (high level) is not true.

Nodes h453 and h454 in FIG. 9B indicate the open condition of the feed valve 232 and drain valve 231 respectively. These conditions may be utilized to arrive at various open and closed combinations of these valves. For example, rule r487 utilizing AND function 340 considers the feed valve 232 being open and the drain valve 231 being closed, to arrive at a conclusion, at node h465 that the feed valve is open and the drain valve is closed. Although not illustrated, similar logic may be exercised to determine that the feed valve is closed while the drain valve is opened. Similarly, rule r528 utilizing AND function 341 generates a conclusion at node h469 that both valves are open (since there is no negation function at AND 341) leading to an abnormal condition indication at node m453, linked by rule r529, that the drain and feed valves on the drain regulator tank are opened simultaneously, a condition that should not be occurring.

The simultaneous condition of the valves as set forth at nodes h465 and h469 are utilized to determine, along with other evidence, further abnormal operating conditions. For example in FIG. 9A rule r489 utilizes an AND function 344 to relate the existence of the tank level backing up, from node h455, coupled with the feed valve being open while the drain valve is closed, from node h465 into a belief, at node m448 that the drain regulator tank level is high due to the feed valve being stuck open and the drain valve closed.

If the drain tank level is backing up and the condition of node m448 is not present, that is, the level is not high due to the feed valve being stuck open, and if both valves are not open, then a conclusion is drawn that the tank is backing up due to some obstruction in the drain line thereby preventing normal draining. This thinking manifests itself in FIG. 9A by rule r491, including AND function 346, which links to abnormal condition m449 setting forth the probable problem. Additional evidence is provided by rule r4033 linked to the high level gauge reading of node h464.

By examining various hypotheses and by similar thinking other abnormal conditions pertaining to the drain regulator tank may be provided such as causes of a resultant low level in the drain regulator tank.

FIG. 10

Figure 10:
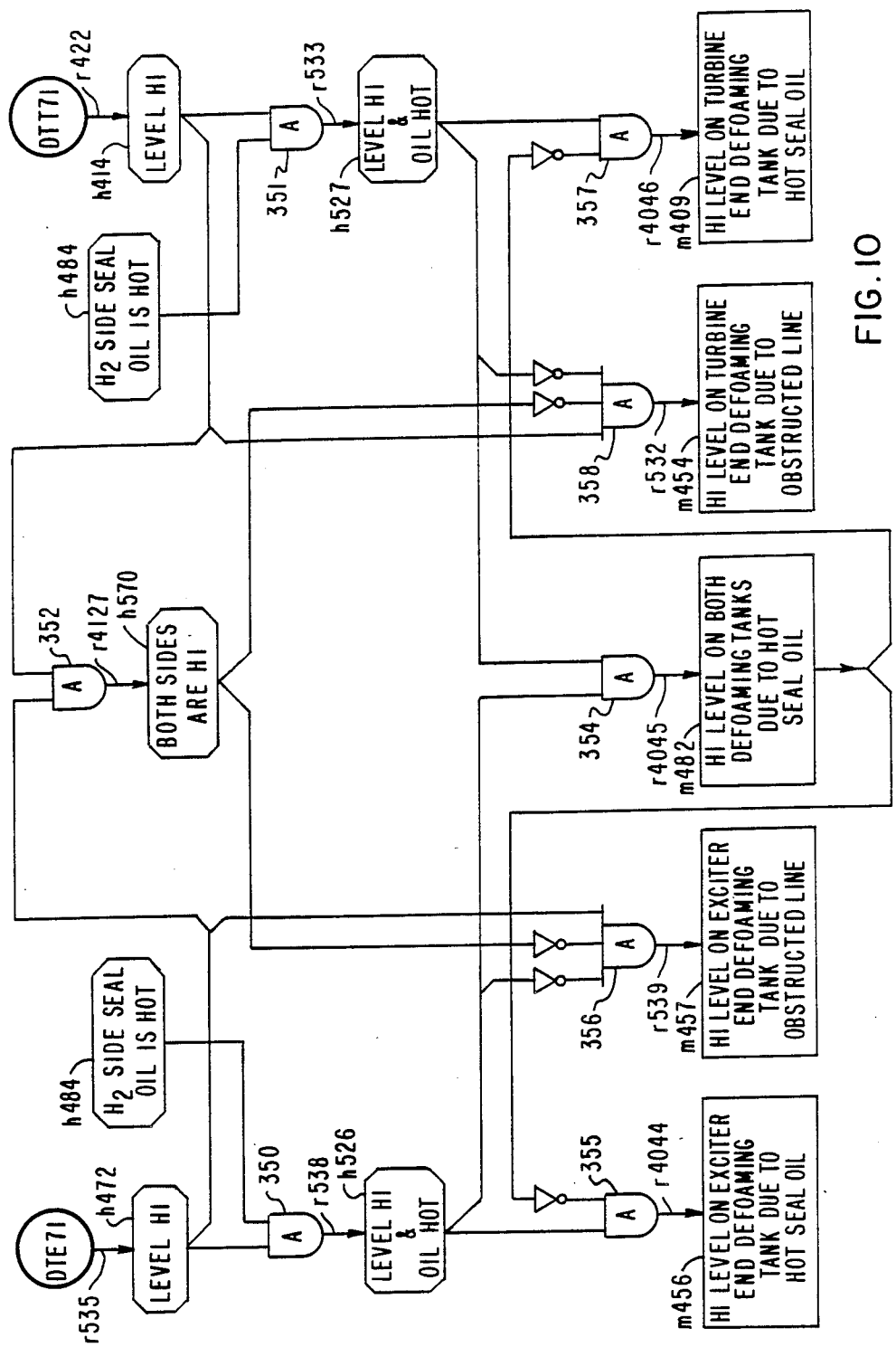

FIG. 10 presents some abnormal conditions relative to the defoaming tanks 60e and/or 60t. The diagnostic process illustrated in FIG. 10 utilizes the status of the exciter and turbine end defoaming tank sensors DTE71 and DTT71 the conditions of which are placed into respective sensor nodes DTE71 and DTT71.

With respect to the exciter end diagnosis, rule r535 converts the contact input into a belief at node h472 that the exciter end defoaming tank level is high. If the hydrogen side oil is also hot as set forth at node h484, then rule r538 utilizing AND function 350 arrives at the conclusion at node h526 that the oil level in the defoaming tank 60e is high and contains hot oil. The same conclusion is reached at node h527 in the analysis of the turbine end defoaming tank utilizing the sensor input of DTT71, rule r422, hypothesis h414 and rule r533 utilizing AND function 351.

The determination at node h570 that both the exciter end and turbine end defoaming tank levels are high may be made with rule r4127 in conjunction with AND function 352 which examines the high level hypotheses at nodes h472 and h414.

With this information, various conclusions may be drawn as to possible abnormal conditions relating to the exciter and turbine end defoaming tanks. For example, if the hydrogen side oil is hot it will be less viscous and will flow more readily. If the level is high in both the exciter and turbine end defoaming tanks and if the oil is hot in both of these tanks, then rule r4045 utilizing AND function 354 determines at node m482 that the high level on both defoaming tanks is due to the hot hydrogen side seal oil.

With respect to the exciter end defoaming tank, rule r4044 utilizing AND function 355 checks to see that the level is high and the oil is hot in the exciter end defoaming tank and that there is not a high level in both defoaming tanks from node m482, to arrive at the conclusion of node m456 that there is a high level on the exciter end (only) defoaming tank due to hot oil.

The high level could also be due to some obstruction in the drain line which goes to the drain regulator. This condition is presented at node m457 and is determined by rule r539 utilizing AND function 356. The evidence presented is that the level is high but not due to hot oil (node h526), that both sides are not high (node h570) and that the level is high in the exciter end defoaming tank (node h472).

The identical conclusions are presented for the turbine end defoaming tank at nodes m409 and m454 utilizing rules r4046 and r532 with their respective AND functions 357 and 358.

FIG. 11

Figure 11:
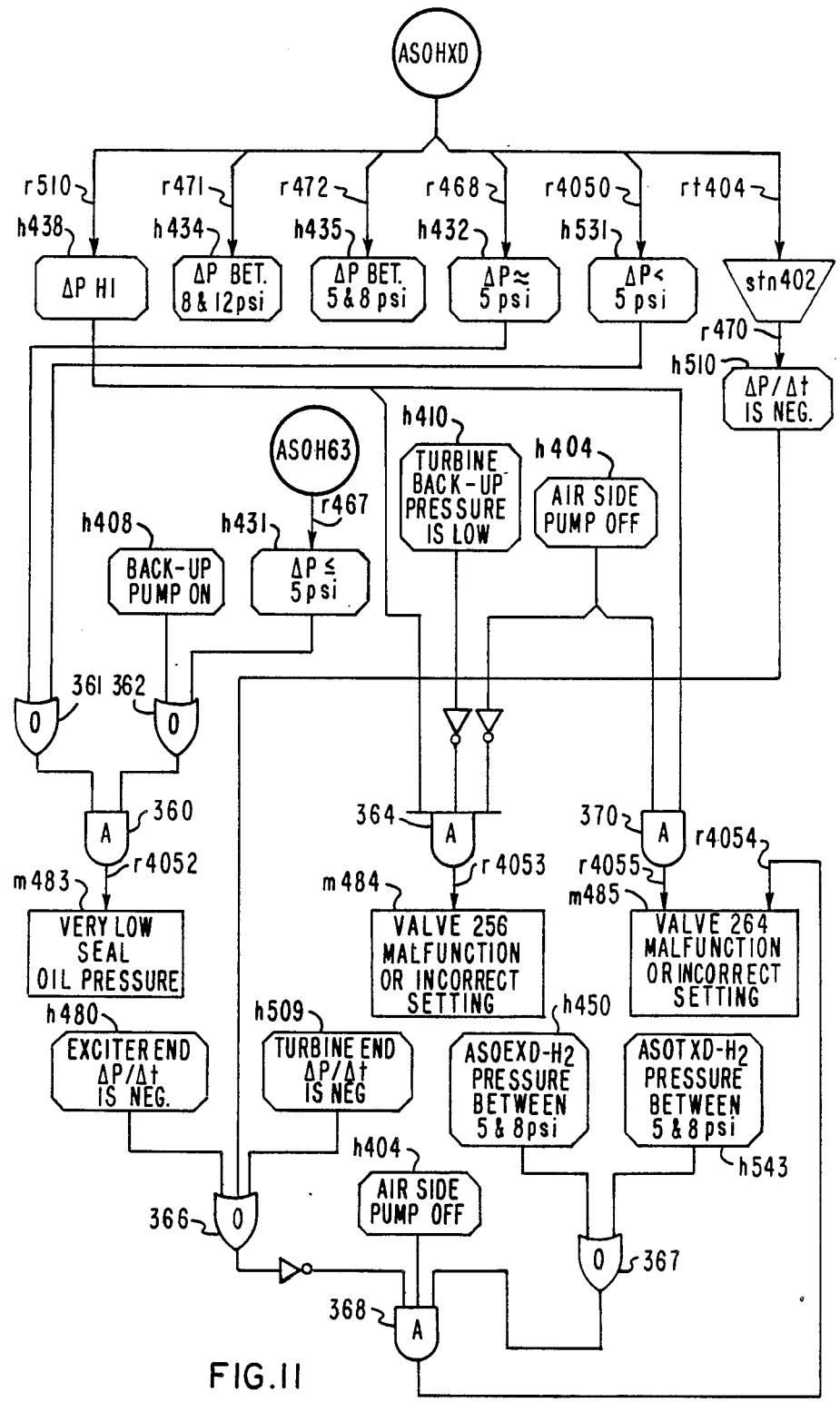

The arrangement of FIG. 11 looks at the output of sensor ASOHXD which provides to its counterpart sensor node the value of the differential pressure between the hydrogen and air side oil pressures. Under normal operating conditions the oil pressure may be around 87 psi and the hydrogen gas pressure around 75 psi resulting a difference of 12 psi. That is, the differential pressure $\Delta P = 12$ psi.

Some of the possible differential pressure values or ranges are set forth in various hypotheses linked to the sensor node by respective rules. For example, node h438 linked by rule r510 is a hypotheses that the differential pressure is high, determined, as are the remainder of the hypotheses, by a piece-wise linear function dependent upon the actual pressures designed for the particular seal oil system. Four remaining pressure ranges are illustrated by way of example and include a differential pressure between 8 and 12 psi, node h434 linked by rule 471, a differential pressure between 5 and 8 psi, node h435 linked by rule r472, a differential pressure approximately equal to 5 psi, node h432 linked by rule r468 and a differential pressure less than 5 psi, node h531 linked by rule r4050.

Storage node stn402 linked to the sensor reading by reading transform rt404 calculates the rate of change of the differential pressure and the determination is made by rule r470 whether this change is negative (i.e. the difference between the two pressures is getting smaller at time goes on), such condition being illustrated at node h510.

An abnormal condition which has an exceptionally high priority is that set forth at node m483 relating to a very low seal oil pressure. Rule r4052 uses the combining logic of functions 360 to 362 to determine whether the differential pressure is below 5 psi. That is, if the oil pressure is not at least 5 psi above the hydrogen gas pressure then an emergency situation may exist. The logic functions associated with rule r4052 state that if the differential pressure is approximately equal to 5 psi or below 5 psi and if the backup pump is on or the pressure switch ASOH63 has activated indicating a pressure less than 5 psi, (rule r467 and hypothesis h431) then the conclusion of low seal oil pressure indicated at m483 is present.

A second type of abnormal condition is indicated at node m484 and related to the malfunction of differential pressure bypass regulator valve 256 which may have failed or which may have an incorrect setting. Rule r4053 utilizes AND function 364 in determining that the differential pressure as measured by differential pressure sensor ASOHXD is high coupled with the fact that the turbine backup pressure is not low and that the air side pump is not off to arrive at the conclusion. That is, as long as the air side pump 50a is correctly operating, the fact that the differential pressure is higher than normal suggests some sort of trouble with valve 256, the setting of which should maintain the desired 12 psi pressure differential during normal operation.

The abnormal condition defined at node m485 relates to the malfunction or incorrect setting of backup differential pressure regulator valve 264. If the air side pump is down, the oil is being supplied by the backup oil supply 70 at a pressure to maintain a differential pressure, with respect to the hydrogen pressure, of 8 psi. If the differential pressure is high and the air side pump is off, then the pressure regulation provided by valve 264 is incorrect since the differential pressure should not be high but should be 8 psi. Rule r4055 utilizing AND function 370 arrives at this malfunction conclusion set forth at node m485.

Other evidence leading to this conclusion is supplied by rule r4054 which combines certain evidence utilizing logic 366 to 368. The differential pressure may be measured directly by sensor ASOHXD and/or indirectly by the individual sensors ASOEXD and ASOTXD compared with the actual hydrogen pressure. If the differential pressure as measured by any one of these three methods is not decreasing, that is, the system is stabilized, as evidenced by the negtion of any of the hypotheses h480, h509 and h510 and if the air side pump is off as evidenced by hypothesis h404 then trouble with valve 264 is indicated if the differential pressure is less than what it is supposed to be, 8 psi, this evidence being presented to OR function 367.

FIG. 12

Figure 12:
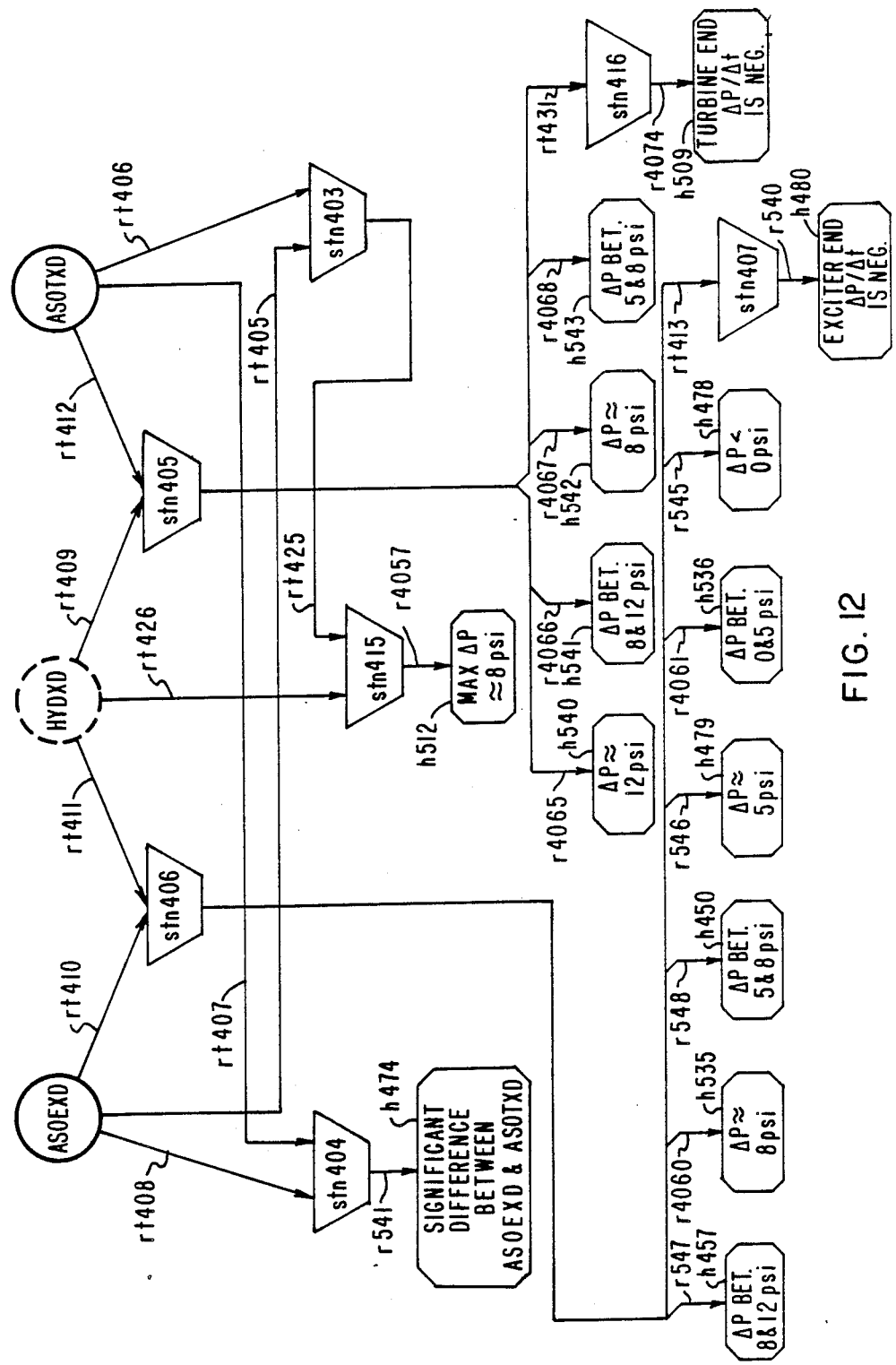

The diagnostic procedure illustrated in FIG. 12 utilizes individual sensor readings to establish differential pressure ranges. Sensor nodes ASOEXD and ASOTXD receive pressure values from their respective sensors indicative of the gland seal air side oil pressure at the exciter end and at the turbine end respectively. The hydrogen pressure stored in node HYDXD is subtracted from the turbine and exciter end pressure values in respective storage nodes stn405 and stn406 linked by respective reading transform rules rt409 to rt412.

Several of the differential pressures with respect to the exciter end are set forth below together with their associated hypothesis and rule, each of which would incorporate a different piece-wise linear function:

| Differential Pressure | Hypothesis | Rule |
| --- | --- | --- |
| Between 8 & 12 psi | h457 | r547 |
| Approximately 8 psi | h535 | r4060 |
| Between 5 & 8 psi | h450 | r548 |
| Approximately 5 psi | h479 | r546 |
| Between 0 & 5 psi | h536 | r4061 |
| Less than 0 psi | h478 | r545 |

In addition, reading transform rt413 links the difference, in storage node stn406, to storage node stn407 which derives the change in differential pressure with respect to time and rule r540 determines whether this change is negative, at node h480.

Several differential pressure values with respect to the turbine end are set forth below.

| Differential Pressure | Hypothesis | Rule |
| --- | --- | --- |
| Approximately 12 psi | h540 | r4065 |
| Between 8 & 12 psi | h541 | r4066 |
| Approximately 8 psi | h542 | r4067 |
| Between 5 & 8 psi | h543 | r4068 |

In addition, the belief in a negative rate of change is established at node h509 utilizing rule r4074, storage node stn416 and reading transform rt431.

FIG. 12 additionally illustrates other information which may be derived from the sensor readings. For example, storage node stn403 linked to sensor node ASOEXD by reading transform rt405 and to ASOTXD by reading transform rt406 is operable to determine the higher (if any) of these two readings. The higher valued reading is linked by reading transform rt425 to storage node stn415 which also receives the hydrogen pressure via reading transform rt426 and computes the difference. By means of a piece-wise linear function associated with rule r4057, a determination is made as to whether or not the maximum differential pressure is around 8 psi, as depicted at node h512.

Reading transforms rt407 and rt408 also place the sensor values into storage node stn404 which computes the difference between them and by means of a piece-wise linear function associated with rule r541 a determination is made, at node h474 as to whether or not a significant difference exists between the readings. A significant difference may be, by way of example, in the order of 2 psi.

FIG. 13

Various differential pressure values set forth in FIG. 12 may be utilized in the diagnosis of various abnormal conditions. For example, one such condition is illustrated at node m458 at the bottom of FIG. 13 and relates to a worn air side seal oil ring on the exciter end (only) gland seal. Several pieces of evidence are utilized to arrive at the conclusion, and rule r557 utilizing AND function 380 illustrates some considerations. For example, the combination of evidence leading to the worn seal oil ring conclusion includes the fact that a significant difference exists between the ASOEXD and ASOTXD readings (h474) coupled with the fact that the air side pump is on (negated h404) and the differential pressure is less than 12 psi at the exciter end while the differential pressure at the turbine end is approximately 12 psi (h540). The conclusion that the differential pressure at the exciter end is less than 12 psi is set forth at node h549 linked by rule r551, utilizing OR function 381, to the various pieces of evidence set forth relating to several differential pressure values derived in FIG. 12 and all being less than 12 psi.

Other evidence of a worn seal oil ring on the exciter end is provided by rule r554 utilizing AND function 382 examining the evidence of the differential pressure being less than 8 psi, and the air side pump being off (h404), a significant difference between the sensor readings exist (h474), the backup pump is not on (negated h408) and the turbine end differential pressure is around 8 psi (h542). These considerations are somewhat similar to those considered with respect to rule r557 however these are applied to operation of the system wherein the backup oil supply 70 is activated, during which time differential pressure is supposed to be 8 psi. The determination that the differential pressure is less than 8 psi is depicted at node h550e and is accomplished with rule r552 utilizing OR function 383 to consider the various differential pressure values depicted.

An increased oil flow adds some confidence that there is a worn seal oil ring and this increased flow manifests itself by a higher differential pressure appearing across the air side filter 58a. This determination is made at node h462 which is linked to node m458 by rule r556 and is linked to sensor input ASOFXD by rule r426.

Figure 13:
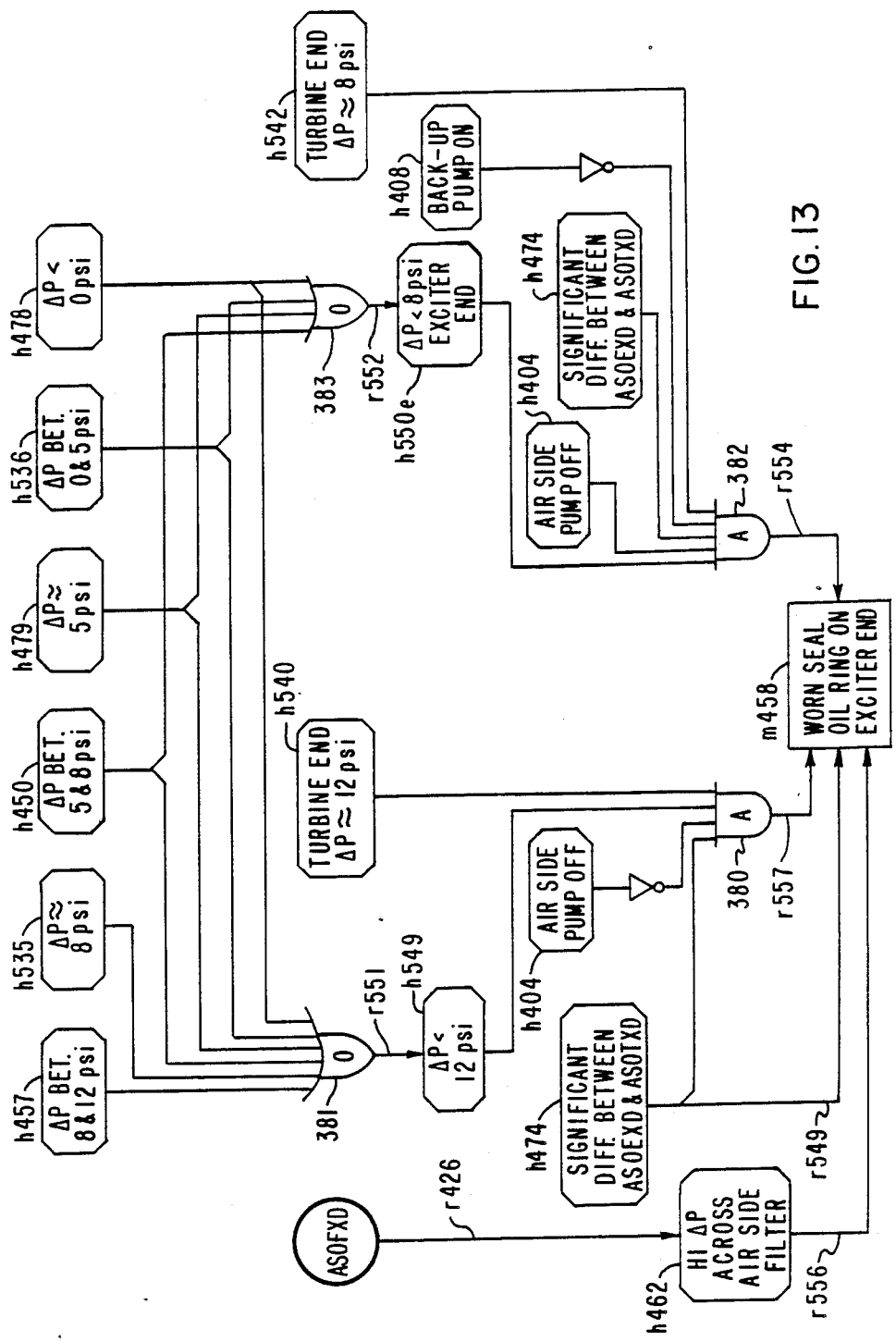

The last piece of evidence depicted in FIG. 13 leading to the conclusion deals with rule 549 and hypothesis h474 which establishes the existence of a significant difference between the two pressure sensor readings. The fact that there is a significant difference does not necessarily means that there is a worn seal oil ring, however the absence of this evidence would indicate a contrary conclusion.

By utilizing the pressure sensor on the turbine end, and the differential pressures derived with that sensor, the diagnostic process illustrated in FIG. 13 can be equally applied to the determination of a worn air side seal oil ring on the turbine end. Hypothesis h550t utilized in FIG. 8A and establishing a differential pressure less than 8 psi at the turbine end would be derived exactly as h550e for the exciter end, using pressure ranges derived with sensor ASOTXD instead of ASOEXD.

FIG. 14

Figure 14:
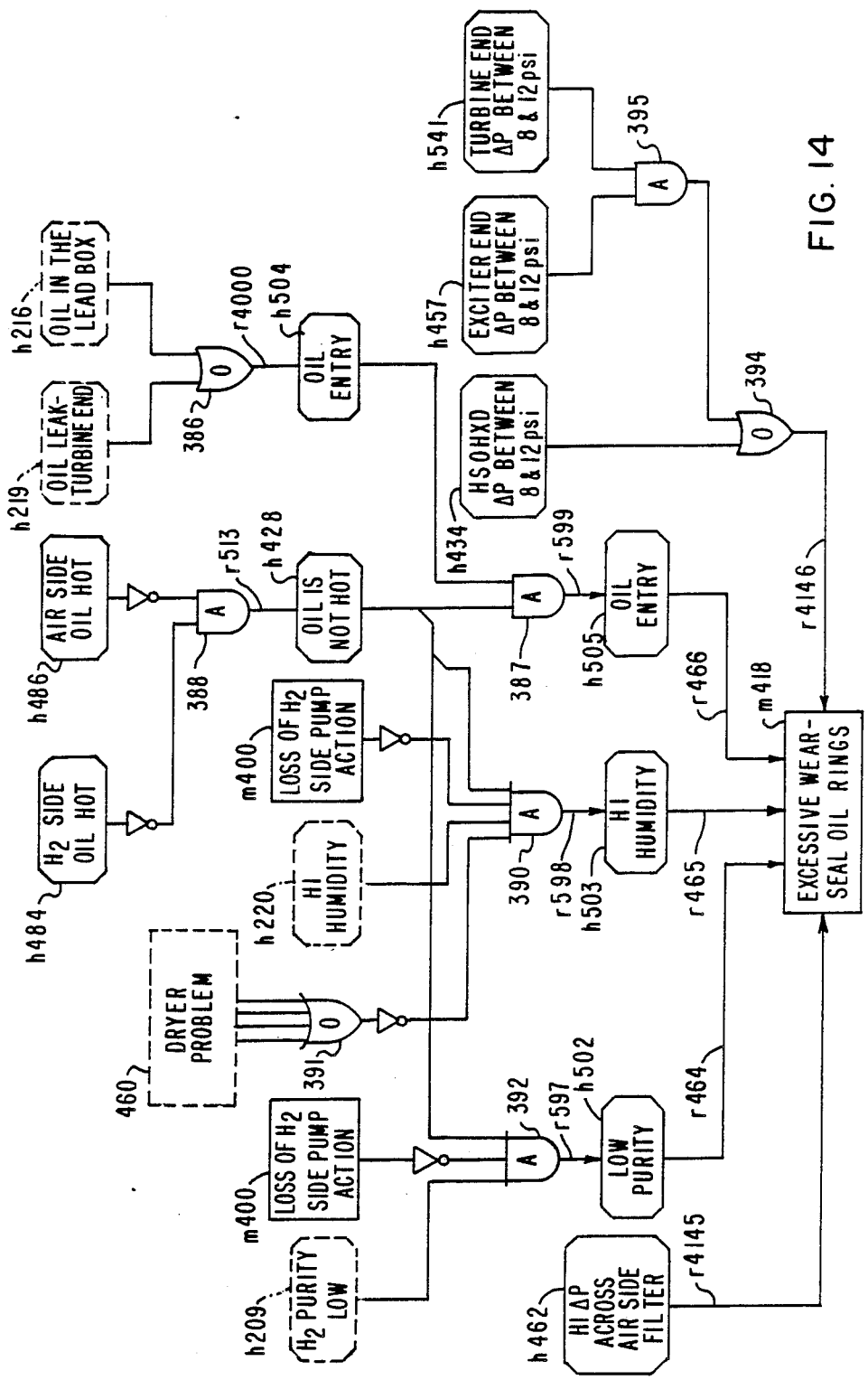

FIG. 14 illustrates the diagnostic process for determination of the general condition of excessive ring wear and not the specific condition of air side ring wear on the exciter end (or turbine end) as set forth in FIG. 13. The determination of hydrogen side ring wear could be made if hydrogen side pressure sensors were provided, however the arrangement of FIG. 2 only includes air side sensors ASOEXD and ASOTXD. Accordingly, the determination of general seal oil ring wear, as set forth in FIG. 14, is based upon evidence other than would be provided by hydrogen side sensor readings.

If the hydrogen side portion of the seal oil ring is worn, there will be excessive oil flow due to the greater gap between the seal and the shaft. When this occurs, oil may work itself into the generator housing along the shaft or the defoaming tank may back up to a point where oil enters the generator. Accordingly, one of the prime considerations for seal oil ring wear is the possibility of oil entry into the generator. The generator includes oil leak detectors as part of the hydrogen purity system and if there is an oil leak detected at the turbine end or if there is oil in the generator's lead box, indicating an oil leak at the exciter end, then rule r4000 utilizing OR functon 386 determines, at node h504 that there is oil entry.

With respect to the problem of worn seal oil rings, however, oil entry may be due to the fact that the oil is excessively hot, in which case the gland seal ring may expand thus increasing the gap between it and the shaft thereby resulting in oil entry. Accordingly, rule r599 utilizing AND function 387 arrives at the determination, at node h505 of oil entry, only after additional consideration of the oil temperature. This is accomplished at node h428, with the conclusion that the oil is not hot being reached by rule r513 utilizing AND function 388 and the evidence of hypotheses h484 and h486 which, when negated, states that the hydrogen side oil as well as the air side oil is not hot.

The purpose of the dual oil system, that is, the hydrogen side supply and the air side supply is to prevent the hydrogen side oil from becoming contaminated with water or air. If there is excessive ring wear, the air side oil may mix with the hydrogen side oil and contaminate it such that water and air which normally may be present in the air side oil diffuses out of the hydrogen side oil and is mixed with the general atmosphere within the generator to increase its humidity and decrease its purity. Node h503 linked to node m418 by rule r465 depicts the high humidity problem. The evidence for this is presented to rule r598 utilizing AND function 390. OR function 391 considers evidence from the hydrogen system and depicted under the generic category of dryer problem 460. In other words, for the high humidity consideration, there must not be a problem with the dryer normally provided as part of the hydrogen system 16 since a dryer malfunction could be the actual cause of the high humidity. Node h220 from that same system provides the evidence of high humidity and rule r598 further considers that the hydrogen side pump must be on (negated in 400) and that the oil is not hot, as previously discussed.

In a similar fashion, the determination of low purity at node h502, linked to node m418 by rule r464 is made utilizing AND function 392 which considers evidence that the hydrogen purity is low, that the hydrogen side pump is not off and that the oil is not hot.

The confidence in excessive ring wear at node m418 is modified by rule r4146 if the differential pressure is not within the proper operating range. The evidence of AND function 395 states that both the exciter end and turbine end differential pressures must be between 8 and 12 psi derived from the individual respective exciter end and turbine end pressure sensors ASOEXD and ASOTXD and the hydrogen pressure sensor HYDXO. Alternatively, utilizing OR function 394 this same pressure differential range may be established by the single sensor HSOHXD.

A final consideration to the abnormal condition is provided by rule r4145 which has as evidence a high differential pressure across the hydrogen side filter, indicative of a greater oil flow due to worn rings.

FIG. 15 (A and B)

Figure 15A:
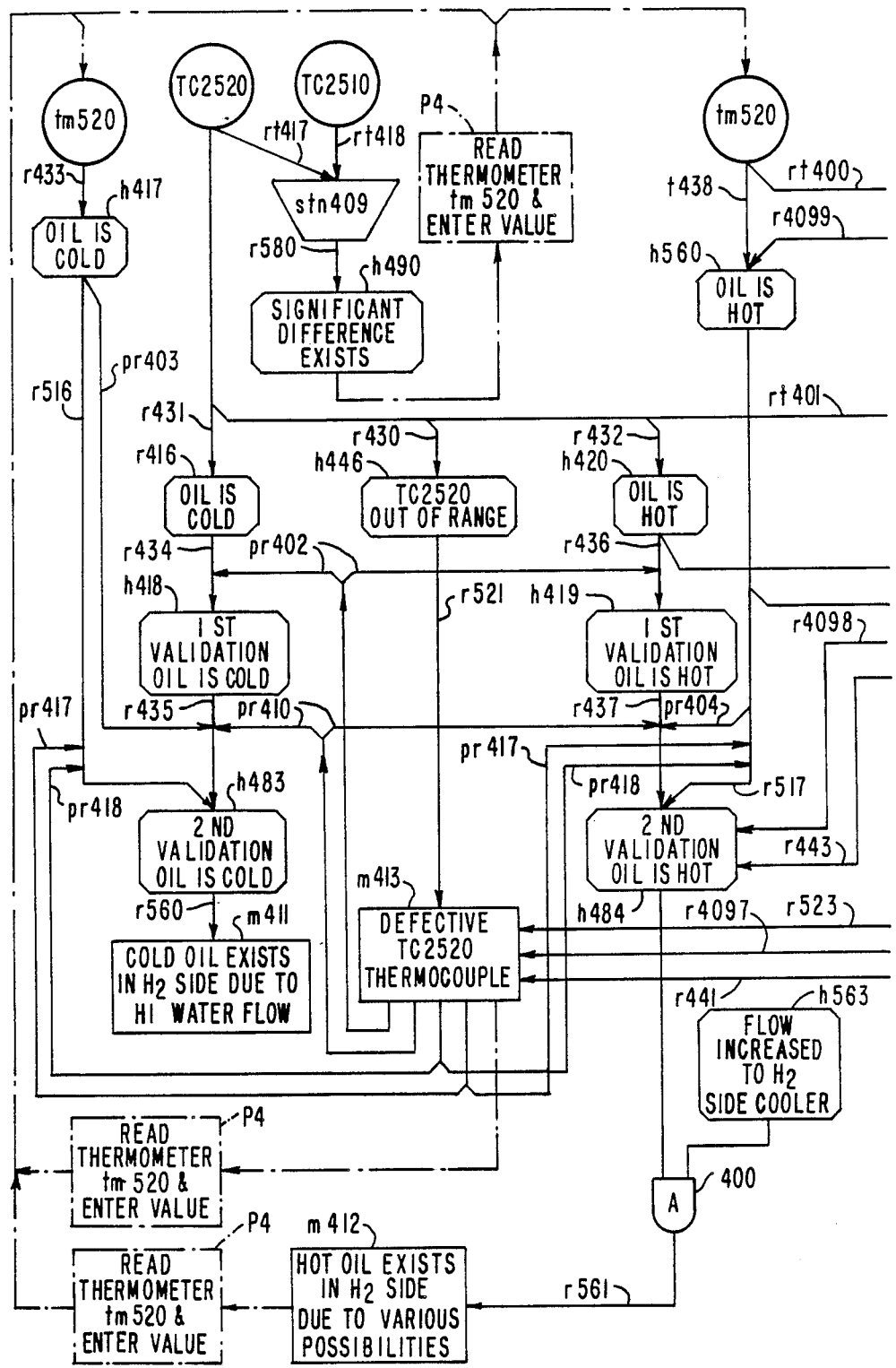
Figure 15B:
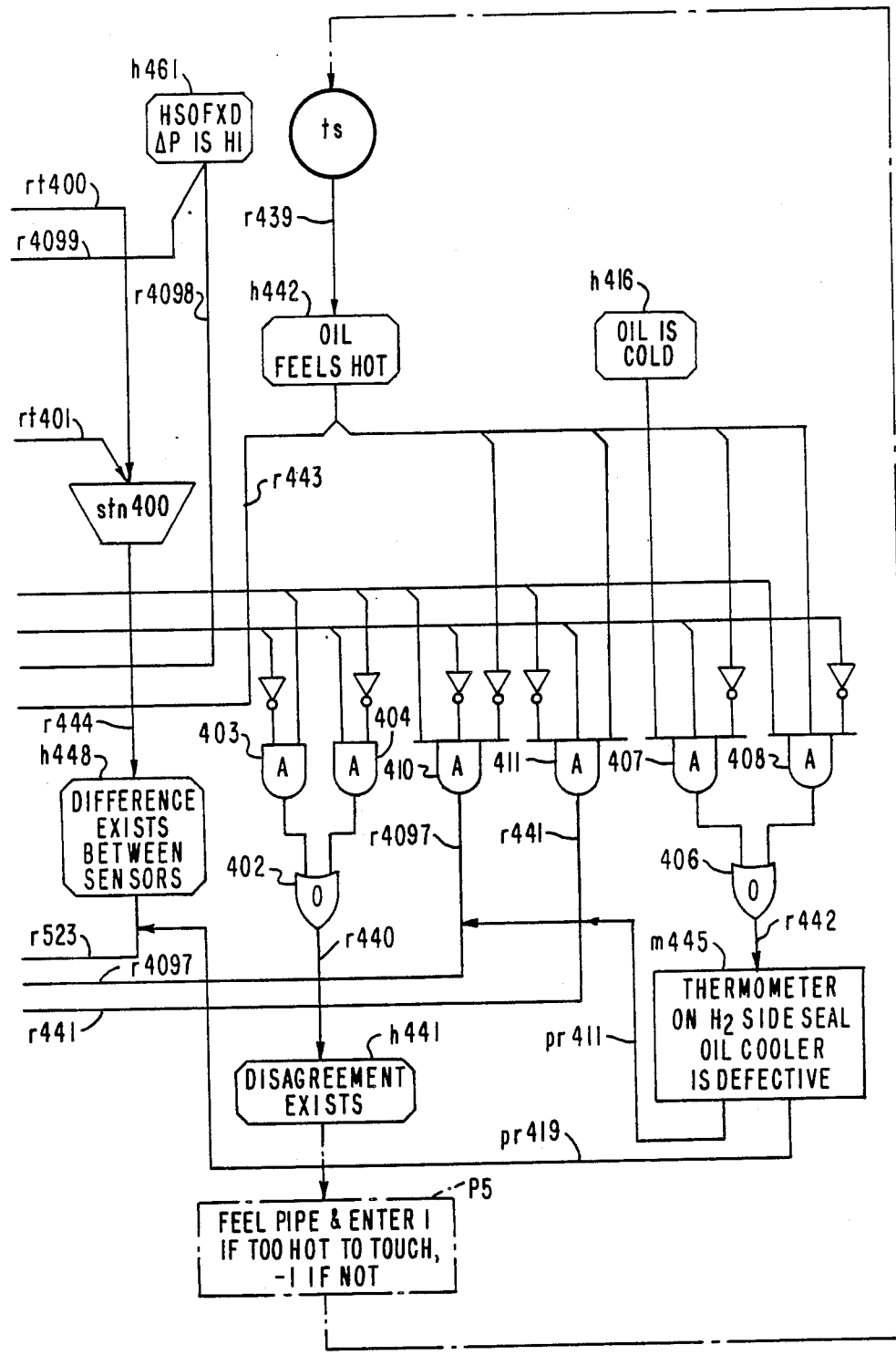

FIGS. 15A and 15B illustrate several abnormal conditions which may be diagnosed with respect to the hydrogen side oil temperature. Identical considerations can be given to the air side oil temperature using the respective appropriate sensors.

The hydrogen side oil temperature is derived from thermocouple TC2520 at the output of cooler 54h. Using rule r430, the reading of TC2520 is examined and if it is above or below predetermined known amounts, the determination is made, at node h446 that the thermocouple reading is out of range leading to a defective thermocouple conclusion at node m413 via rule r521.

If a defective thermocouple is initially determined, a procedure P4 may be indicated to the operator whereby thermometer tm520 is to be read and the temperature value entered into the diagnostic system where it becomes resident in sensor nodes tm520. Another condition for initiating this same procedure is if a significant difference exists between the hydrogen side and air side thermocouples TC2520 and TC2510. Reading transforms rt417 and rt418 provide the thermocouple values to storage node stn409 which calculates the difference between the two and if a significant difference exists, it will be indicated at node h490 linked to the storage node by rule r580. The existence of this significant difference results in an operator reading of the thermometer values and its entry into the system.

The diagnostic process examines the output of TC2520 to see if the oil is cold or hot. This is respectively accomplished with rule r431 and node h416 for the cold determination, and rule r432 and node h420 for the hot determination.

If there is an indication of a defective thermocouple at node m413, paralt rule pr402 will change the sufficiency of rules r434 and r436 leading to a first validation of cold and hot oil in nodes h418 and h419. If the confidence in the defective thermocouple determination is negative, that is, the thermocouple is believed to be okay, the sufficiency of rules r434 and 436 will remain unchanged. A paralt rule pr410 is additionally utilized to change the necessity function of rules r435 and 437 leading to respective second validations of the cold and hot state of the oil at nodes h483 and h484.

Other evidence is presented for these latter determinations as well as for the determination of a defective thermocouple. For example, at the upper left portion of FIG. 15A, the thermometer reading at node tm520 is related to a determination of cold oil at node h417 by rule r433. If the oil is cold as determined by the thermometer reading, a paralt rule pr403 will increase the sufficiency of rule r435 tending to further validate the cold reading provided by the thermocouple TC2520. Rule r516, whose evidence is the cold oil from node h417 contributes some degree of confidence to the second validation of cold oil at node h483. If a determination of a defective thermocouple is made, paralt rules pr417 and pr418 will increase the sufficiency and necessity of rule r516 so that the cold oil determination is predominantly made by the thermometer reading, since the thermometer is less likely to be defective. If the indicaton is that the thermocouple is not defective, the sufficiency and necessity of rule r516 will be decreased so that the cold oil determination is made utilizing the thermocouple reading. Once the validation of cold oil has been made, rule r560 links this to the abnormal condition indicated at m411 that cold oil exists in the hydrogen side, with the likelihood that it is due to high water flow through the hydrogen side cooler.

If it has been determined, at node h484 that the oil is really hot, rule r561 utilizing AND function 400 takes the existence of the hot oil and couples it with the fact that the water flow to the cooler has been increased, node h563, to arrive at the conclusion that hot oil exists, but the cause is unknown. This observation at node m412 is also operative to trigger procedure P4 if not already done.

The hypothesis of hot oil at node h484 utilizes other evidence in arriving at this conclusion. For example, the operator entered reading of thermometer tm520 is mapped into a belief, at node h560 that the oil is hot, by rule r438. If the oil is hot, there is an increased flow thus causing a higher differential pressure across the hydrogen side filter 58h and accordingly rule r4099 uses this evidence to increase the belief in hot oil at node h560. This same high differential pressure indication is additionally linked by rule r4098 to the validated hot oil determination of node h484 to participate in the determination.

Rule r517 provides further evidence to node h484 that the oil is hot and in a manner similar to the cold oil determination, paralt rules pr417 and pr418 are used to change the sufficiency and necessity of rule 517 depending upon the determination of a defective thermocouple. Operation of paralt rule pr404 is similar to that of paralt rule pr403 in that it will increase the sufficiency of rule r437 tending to further validate the hot reading provided by the thermocouple, since the on-line and off-line sensors agree.

The hypothesis at node h441 in the lower lefthand portion of FIG. 15B states that a disagreement exists between the on-line sensor reading of the thermocouple TC2520 and the visual reading of the thermometer tm520. This conclusion is reached by rule r440 utilizing OR function 402 and AND functions 403 and 404. Basically, the rule examines the thermocouple and thermometer readings and if the thermocouple indicates that the temperature is hot while the thermometer indicates that it is not hot, or conversely, if the thermometer indicates that the temperature is hot while the thermocouple indicates that it is not hot, then a disagreement exists and signals for procedure P5 which requires the operator to feel the oil pipe coming from the cooler and if it feels hot, a 1 is entered by operation of the keyboard and if it is not hot, a −1 is entered, with the results appearing at tactile sensor node ts.

The reading ts can be used as a rough check on the thermocouple and thermometer. This third level backup utilizes rule r439 to map the belief in a hot oil condition into a conclusion of hot oil at node h442. If the oil in fact does feel hot, rule r443 linking this node with the validated hot oil conclusion at node h484 adds some evidence to this validation.

Rule r442 at the extreme right of FIG. 15B utilizes the three readings, that is, the thermocouple, thermometer and tactile to determine whether or not the thermometer in actuality is defective. This determination is made with a plurality of functions 406 to 408 which examines both the cold side and hot side conditions and states that if the thermocouple indicates that the oil is cold and the thermometer indicates that the oil is hot while the tactile sensor indicates that the oil is not hot, then two out of three indications pointing to cold oil suggests that the thermometer is in error as depicted at node m445. Similarly, with respect to a hot oil determination, if the thermocouple indicates that the oil is hot and the tactile sensor indication is that the oil is hot while the thermometer indicates that the oil is not hot, then a defective thermometer is likewise indicated.

With the establishment of a defective thermometer, other rules involving a thermometer reading may now be modified to decrease their contribution in the determination of a defective thermocouple at node m413. For example, by means of reading transforms rt400 and rt401, the difference between the thermometer reading and thermocouple reading is established at storage node stn400. Rule r444 examines the difference and if it is greater than for example 5 to 8 degrees, a high confidence in the difference is established at node h448 and since the likelihood is that a thermometer reading is valid while a thermocouple is subject to failure, rule r523 increases the confidence of a defective thermocouple at node m413. If, however, it has been determined at node m445 that the thermometer in actuality is defective, a paralt rule pr419 is operable to change the sufficiency of rule r523 to terminate the belief in the difference so that it has no effect on the defective thermocouple determination.

As a further example, rules r4097 and r441 in FIG. 15B utilize AND functions 410 and 411 to examine the three indications of hot oil, namely, the thermocouple reading, the thermometer reading and the tactile reading. If the thermocouple disagrees with the other two, then confidence in a defective thermocouple at node m413 is increased. If the combinations are not present, nothing is done to add or detract from the belief in the defective thermocouple. If, however, the thermometer is defective, the necessity of these rules may be increased by a paralt rule pr411 so as to reduce the belief in a defective thermocouple, in view of the thermometer reading no longer being valid.

FIG. 16 (A and B)

Figure 16A:
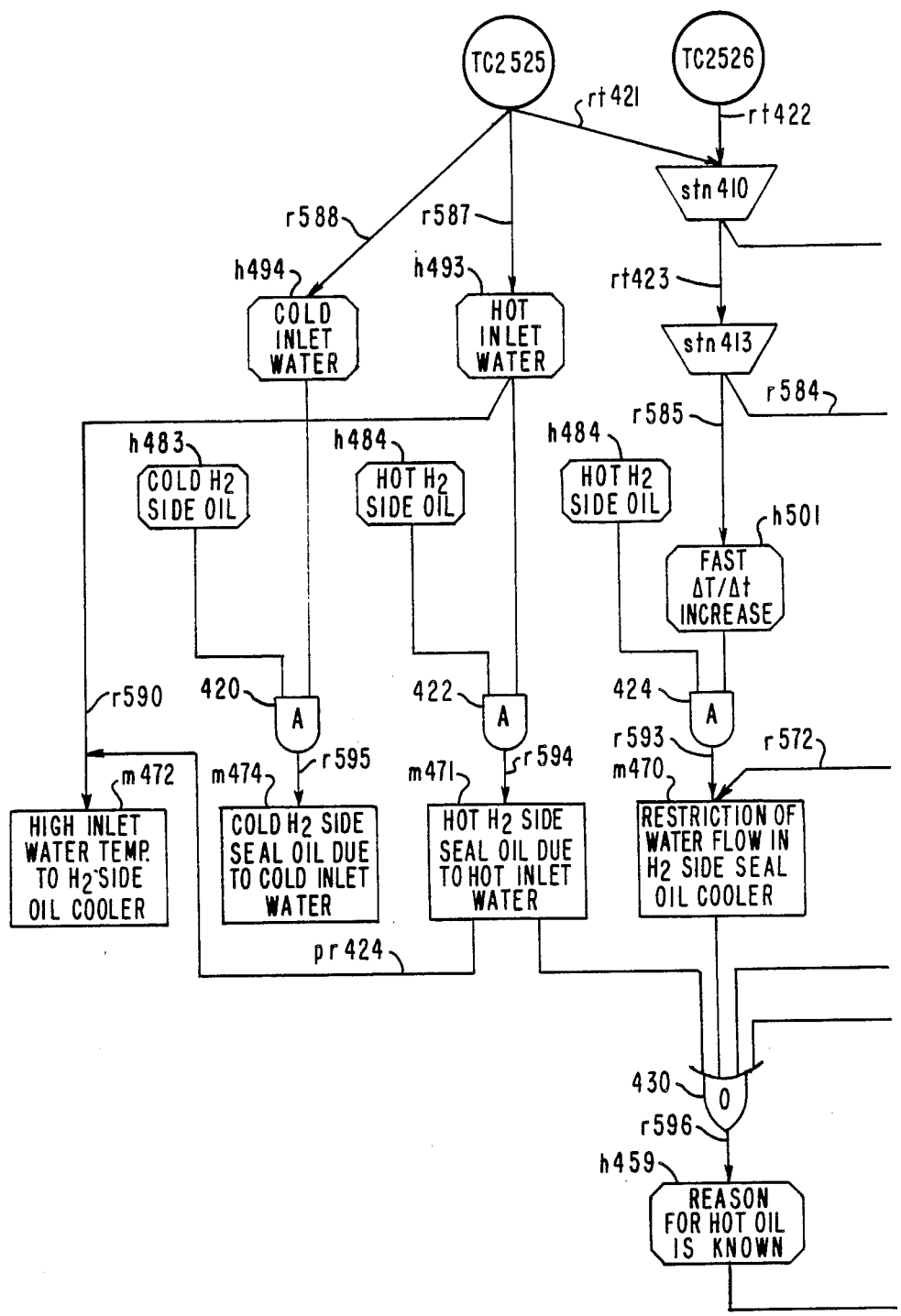
Figure 16B:
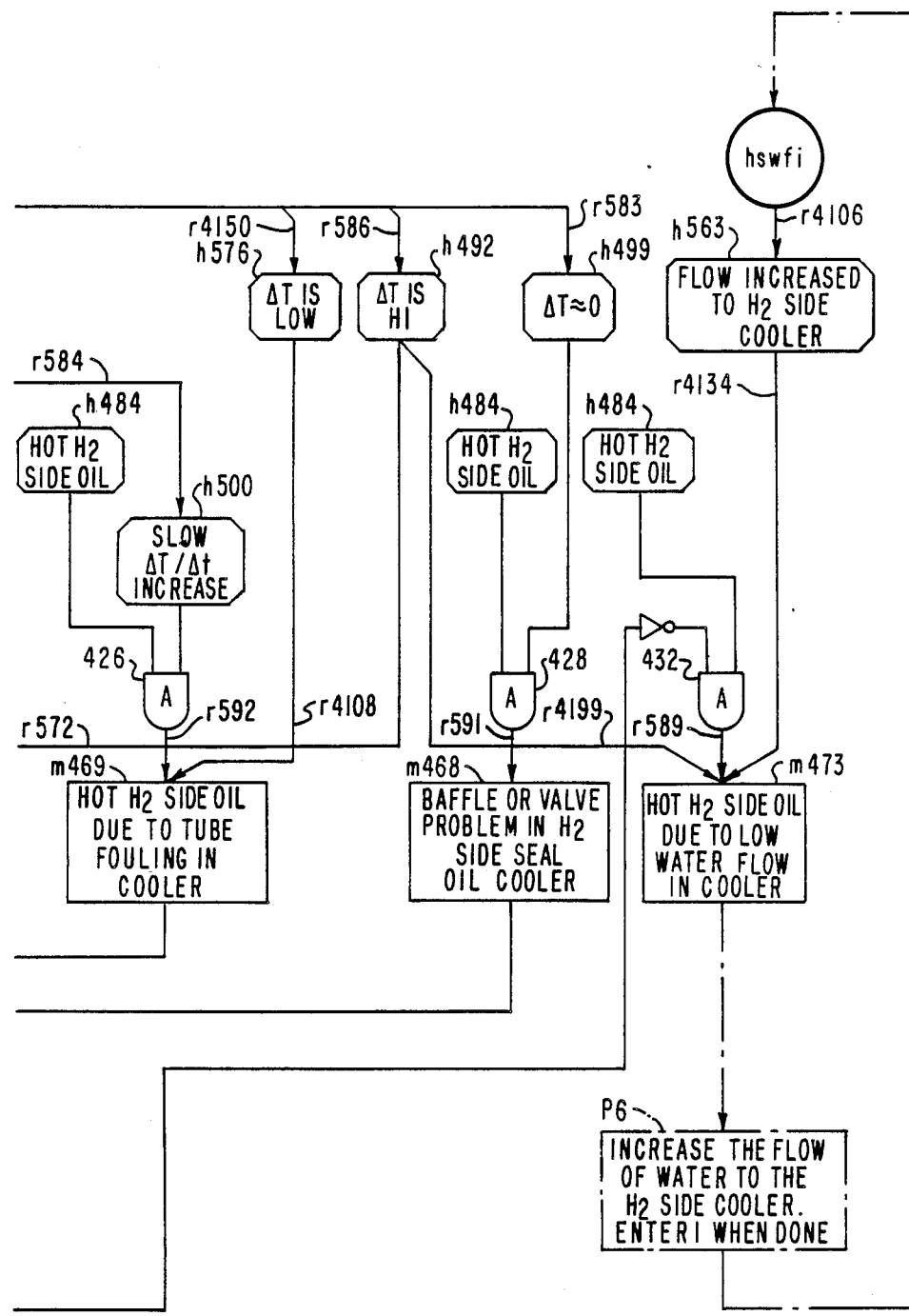

FIGS. 16A and 16B illustrate, by way of example, various abnormal conditions which may be associated with the cooler 54h, and particularly with the cooling water supply in pipes 55h and 56h. Again, the process is identical with respect to the air side cooler 54a with water pipes 55a and 56a, utilizing the respective sensors associated with these components.

Thermocouple readings are placed into sensor nodes TC2525 and TC2526 and are indicative of the cooler inlet and outlet water temperatures respectively. Various beliefs in the temperature condition and the differential temperature condition are established by the rule base. For example, rule r588 converts the thermocouple reading of TC2525 into a belief, at node h494, that the inlet water is cold while rule r587 converts the reading into a belief, at node h493, that the inlet water is hot.

Reading transforms rt421 and rt422 provide the readings to storage node stn410 which operates to obtain a difference between the two temperature readings, and rule r4150 (FIG. 16B) converts the difference readings into belief that the differential temperature is low, at node h576. Rules r586 and r583 convert the results of the subtraction process into respective beliefs that the differential temperature is high, at node h492, and that the differential temperature is approximately zero, at node h499.

The rate of change of the differential temperature is also established at storage stn413 linked to the difference value by reading transform rt423. Rules r585 and r584 then convert the change function into a belief that there is a fast rate of rise, at node h501 or conversely, a slow rate of rise, at node h500.

From these established beliefs, various conclusions may be reached, the simplest being at node m472 linked to node h493 by rule 590 and stating the general observation that there is a high inlet water temperature. Rule r595, utilizing AND function 420 couples the belief in a cold inlet water determination of node h494 and an actual cold hydrogen side oil determination previously estabished by thermocouple TC 2520 to reach the conclusion, at node m474 that the hydrogen side seal oil temperature is cold, however, it is now established that it is due to the cold inlet water to the cooler.

In a similar fashion, rule r594 utilizing AND function 422 arrives at the conclusion, at node m471 that the hydrogen side seal oil is hot due to hot inlet cooling water. Once the determination has been made that the inlet cooling water is hot, then there is no need to display the belief of node m472 and accordingly, paralt rule pr424 operates to eliminate the sufficiency of rule r590 to terminate propagation of the belief.

If the hydrogen side oil is hot, and the difference between the inlet and outlet water temperatures is increasing at a fast rate, then rule 593 utilizing AND function 424 converts this evidence into a belief, at node m470 that there must be a restriction in the water flow circuit, and this is particularly true if the differential temperature is high, linked to the belief by rule r572. The restriction may be due to blockage such as by an object, a bent tube, or a leak by way of example, all of these tending to significantly reduce the water flow.

If, however, the water tubes slowly become contaminated such as by algae buildup or the like, a differential temperature will increase relatively slowly with time and rule r592, utilizing AND function 426 converts the slow increase together with a hot hydrogen side oil determination into a belief, at node m469 that the reason for the hot oil is due to tube fouling in the cooler.

Under normal operating conditions, the temperature of the outlet cooler water should be greater than the temperature of the inlet cooler water to reflect the heat removed from the hydrogen side oil. If there is no differential temperature, and if the hydrogen side oil is hot, rule r591 utilizing AND function 428 arrives at the conclusion depicted at node m468 which basically sets forth the proposition that there may be something wrong with the baffles within the cooler, in which case the hot oil would not be directed across the cooling coils properly. The cooler generally has a bypass valve (not illustrated in FIG. 2) and if this valve is opened, the hot oil could be bypassing the cooler. This condition is also implied by node m468.

All of the abnormal conditions indicated at nodes m468 and m471 provide a reason for the hydrogen side sealing oil to be hot. Rule r596 utilizing OR function 430 takes this evidence to conclude, at node h459 that the reason for the hot oil is known. If the reason is not known, as presented as one piece of evidence to AND function 432 of rule 589, and if the oil is hot, the conclusion is reached, at node m473 that since none of the previously described reasons are present, the hot oil must be due to an inadequate water flow in the cooler. This belief is additionally supported by rule r4149 if the differential temperature between the inlet and outlet water is high.

If it is believed that there is low water flow, a procedure P6 is indicated to the operator to increase the flow of water to the cooler and when that is done, a 1 is entered through operation of the keyboard and becomes resident in the node hswfi indicating that the hydrogen side water flow has been increased. Rule r4106 maps this value into a belief that the flow has been increased, as depicted at node h563. Rule r4134 which would have a negative sufficiency factor would subtract belief in the low water flow conclusion of m473.

FIG. 17 (A and B)

Figure 17B:
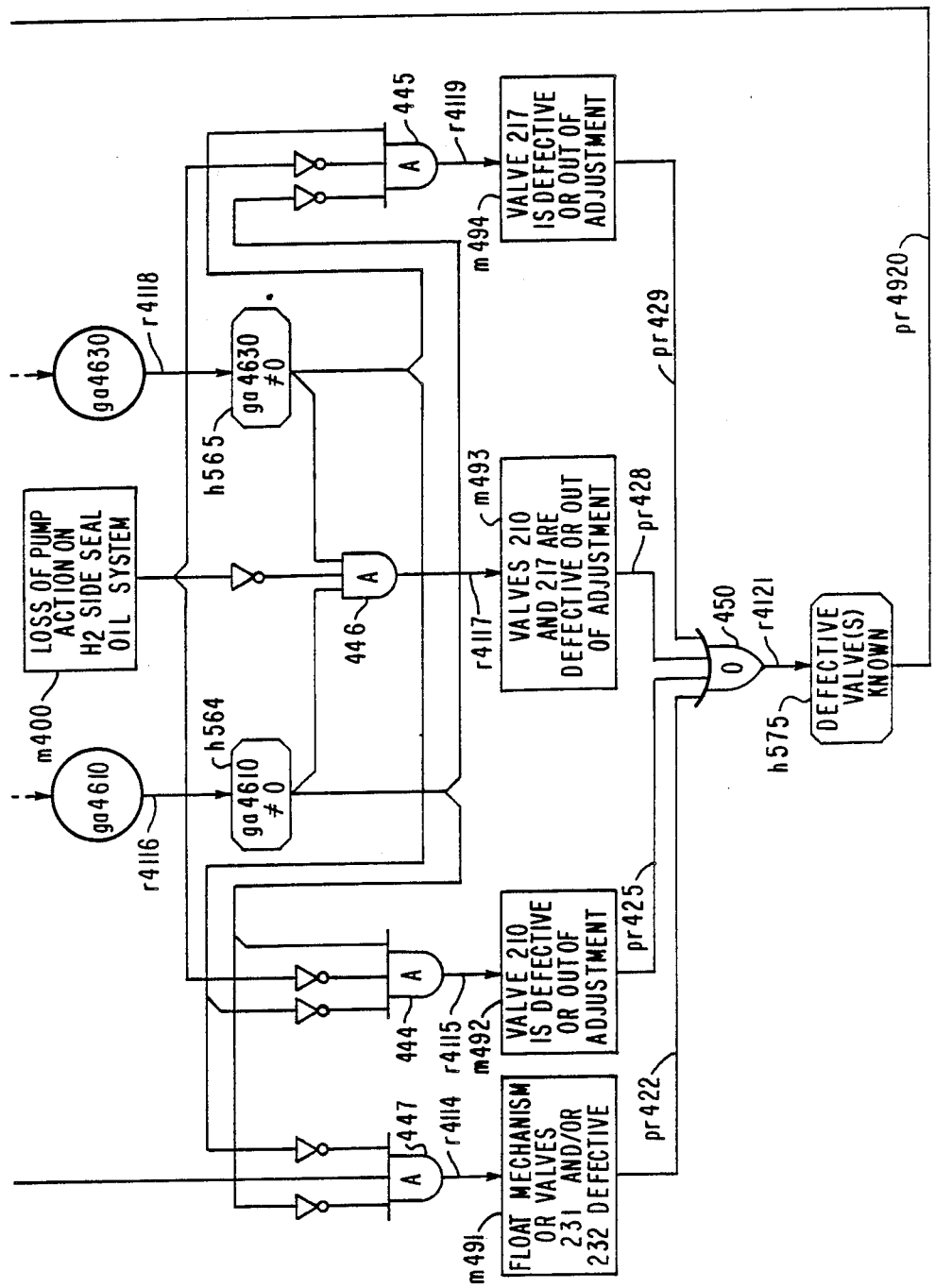

FIGS. 17A and 17B illustrates various conditions relating to the valves on drain regulator 64 and the pressure equalizing valves 210 and 217.

During normal operation, the pressure equalizing valves 210 and 217 should operate so as to make the hydrogen side oil pressure equal to the air side oil pressure. If one pressure is greater than the other, more or less oil will flow into the defoaming tanks, the results of which are seen in the drain regulator tank 64. If too much oil is deposited in the defoaming tanks, the oil level in the drain regulator will rise thereby opening drain valve 231 to compensate, in which case sensor DRD63 provides an output signal indicative of the open condition of the valve If there is less than normal flow into the drain regulator, fill valve 232 will be opened such that sensor DRFXD provides an output signal indicative of the open condition of the valve.

Rule r4113 in FIG. 17A utilizing logic functions 440 to 442 looks at the evidence for the valves being open to arrive at the conclusion, at node h566, that either the drain valve 231 is open and the feed valve 232 is closed, or conversely, that the feed valve is open and the drain valve is closed. If such is the case, then one or both of the pressure equalizing valves 210 and 217 is probably defective, this conclusion at node m490 being reached by means of rule r4120. If the air side oil is entering the hydrogen side defoaming tanks, the air can find its way into the generator housing and a low hydrogen purity indication provided by rule r4112 would additionally support the defective valve conclusion.

The existence of the defective valve indication functions to signal the operator to initiate procedure P7 whereby the pressure differential gauges ga4610 and ga4630 are to be read and their values entered into the system. With pressure equalizing valves 210 and 217 operating properly, the hydrogen side and air side oil pressures should be equal and the gauges, providing an indication of the pressure difference, should therefore read zero. Rules r4116 and r4118 (FIG 17B) convert the respective gauge readings into a belief, at nodes h564 and h565 that the readings are other than zero. This evidence is presented to AND function 444 of rule r4115, to AND function 445 of rule r4119, to AND function 446 of rule r4117 and the AND function 447 of rule r4114.

For rule r4115, gauge ga4610 does not read zero, while gauge ga4630 does (i.e. the negation of does not read zero). Accordingly, these two factors lead to the conclusion at node m492 that valve 210, to which gauge ga4610 is connected, is defective or out of adjustment. This determination, however, is valid only if the hydrogen side pump is running and, accordingly, the evidence of node m400 is included in the determination.

Rule r4119, at node m494, arrives at the same conclusion with respect to valve 217 utilizing similar evidence. If both valves happen to be defective, and the hydrogen side pump is still operating, rule r4117 will convert the evidence into the belief indicated at node m493 that both valves are defective or out of adjustment.

If one of the drain or feed 231 or 232 valves is open and the other closed, or vice versa, but both differential pressure gauges are zero, then in all probability the fault lies with the drain or feed valves 231 or 232. This scenario is depicted by rule r4114 utilizing AND function 447, with the conclusion depicted at node m491.

Thus, if it has been determined which of the valve or valves is defective, then the need to display the general observation of defective pressure regulating valves provided at node m490 (FIG. 17A) is no longer desired. Accordingly, propagation in this belief may be terminated by changing the sufficiency of rule r4120 by means of a paralt rule modification. This may be accomplished in one embodiment by having nodes m491 to m494 generate individual paralt rules for changing the sufficiency. Alternatively, and as indicated in FIG. 17B, rule r4121 can combine all of the evidence of nodes m491 to m494 utilizing OR function 450 to determine, at node h575, that the defective valve or valves is known, in which case paralt rule pr4920 operates on rule r4120 to effectively cut off propagation in the belief of node m490.

Accordingly, there has been described a diagnostic system for arriving at certain conclusions relative to the operating condition of a gas cooled electric generator seal oil system while the generator and seal oil system are on-line. The abnormal conditions described by way of example are representative of many conditions which may be diagnosed and presented to an operator with various degrees of confidence so that proper corrective action, if needed, may be taken.

Various illustrations have been given of the validation of conclusions resulting from sensor readings. In general, such validation would be desirable for the majority of sensor readings and would be performed using one or more of the techniques described herein.

| APPENDIX A | | |
| --- | --- | --- |
| Hypothesis Number | Brief Explanation | FIG. in Which First Derived |
| h400 | Hydrogen side pump 50h is off. | 7A |
| h401 | High air side oil pressure on the exciter end according to gauge ga4610. | 7B |
| h402 | High air side oil pressure on the turbine end according to gauge ga4610. | 7B |
| h403 | The oil pressure as read by gauge ga4650 is approximately equal to the hydrogen gas pressure. | 7B |
| h404 | Air side pump 50a is off (validated). | 8A |
| h405 | The oil pressure at the output of the air side pump is low according to gauge ga4640. | 8B |
| h406 | The oil pressure at the output of the air side pump is normal according to gauge ga4640. | 8B |
| h407 | The oil pressure in the air side line delivering oil to the gland seals is low according to gauge ga4620. | 8B |
| h409 | The hydrogen side pump 50h is off (validated). | 7A |
| h410 | The turbine backup pressure is low according to switch SOB63. | 8A |

APPENDIX A (continued)

| Hypothesis Number | Brief Explanation | FIG. in Which First Derived |
|---|---|---|
| h413 | The oil level in drain regulator 64 is low according to sensor DRT71. | 9 |
| h414 | The oil level is high in the turbine end defoaming tank 62 according to sensor DTT71. | 10 |
| h416 | The hydrogen side oil is cold according to sensor TC2520. | 15A |
| h417 | The hydrogen side oil is cold according to thermometer tm520. | 15A |
| h418 | First validation of cold hydrogen side oil. | 15A |
| h419 | First validation of hot hydrogen side oil. | 15A |
| h420 | The hydrogen side oil is hot according to sensor TC2520. | 15A |
| h428 | Neither the hydrogen side oil nor air side oil is hot. | 14 |
| h432 | The differential pressure between the air side supplied oil and the hydrogen pressure is approximately 5 psi according to differential pressure sensor ASOHXD. | 11 |
| h434 | The differential pressure between the air side supplied oil and the hydrogen pressure is between 8 and 12 psi according to differential pressure sensor ASOHXD. | 11 |
| h438 | The differential pressure between the air side supplied oil and the hydrogen pressure is high according to differential pressure sensor ASOHXD. | 11 |
| h441 | There is disagreement between the readings of thermocouple TC2520 and thermometer tm520 in determining whether the hydrogen side oil temperature is hot. | 15B |
| h442 | The hydrogen side oil is hot according to an operator who has felt the oil delivery pipe. | 15B |
| h446 | Thermocouple TC2520 is out of range. | 15A |
| h448 | The thermocouple TC2520 and thermometer tm520 readings do not agree. | 15A |
| h450 | The differential pressure derived from the exciter end oil pressure sensor ASOEXD and a hydrogen pressure transducer is between 5 and 8 psi. | 12 |
| h453 | Feed valve 232 at the drain regulator 64 is open according to sensor DRFXD. | 9 |
| h454 | Drain valve 231 draining oil from drain regulator 64 is open according to sensor DRD63. | 9 |
| h455 | Oil is backing up out of the drain regulator 64 as determined by sensor DRI71. | 9 |
| h457 | The differential pressure derived from the exciter end oil pressure sensor ASOEXD and a hydrogen pressure transducer is between 8 and 12 psi. | 12 |
| h459 | The hydrogen side oil is hot and the reason for its being hot is known. | 16B |
| h460 | There is high air side pressure at the exciter and turbine ends as determined by gauges ga4610 and ga4630. | 7B |
| h461 | The differential pressure across the hydrogen side filter 58h is high according to sensor HSOFXD. | 7A |
| h462 | The differential pressure across the air side filter 58a is high according to sensor HSOFXD. | 13 |
| h464 | The oil level in drain regulator 64 is high according to sensor olg. | 9 |
| h465 | Feed valve 232 for drain regulator 64 is open while drain valve 231 is closed. | 9 |
| h468 | Indicates a suspicious condition at the drain regulator according to levels and open or closed conditions of feed and drain valves. | 9B |
| h469 | The drain valve 231 and feed valve 232 of drain regulator are both open. | 9 |
| h472 | The oil level in the exciter end defoaming tank 60e is high according to sensor DTE71. | 10 |
| h474 | A significant difference exists between the exciter end air side pressure sensor ASOEXD and turbine end sensor ASOTXD. | 12 |
| h478 | The differential pressure derived from the exciter end oil pressure sensor ASOEXD and a hydrogen pressure transducer is less than 0 psi. | 12 |
| h479 | The differential pressure derived from the exciter end oil pressure sensor ASOEXD and a hydrogen pressure transducer is approximately 5 psi. | 12 |
| h480 | The rate of change of the exciter end differential pressure is decreasing. | 12 |
| h483 | The hydrogen side oil is cold according to thermocouple TC2520 (second validation). | 15A |
| h484 | The hydrogen side oil is hot according to thermocouple TC2520 (second validation). | 15A |
| h490 | A significant difference exists between the thermocouple TC2520 measuring the temperature of the hydrogen side oil and thermocouple TC2510 measuring the temperature of the air side oil. | 15A |
| h492 | The difference in temperature between the outlet and inlet cooling water for cooler 54h as measured by thermocouples TC2526 and TC2525 is high. | 16B |
| h493 | The inlet water to cooler 54h as measured by thermocouple TC2525 is hot. | 16A |
| h494 | The inlet water to cooler 54h as measured by thermocouple TC2525 is cold. | 16A |
| h499 | The difference in temperature between the outlet and inlet cooling water for cooler 54h as measured by thermocouples TC2526 and TC2525 is approximately 0. | 16B |
| h500 | The differential temperature between the outlet and inlet cooling water to cooler 54h as measured by thermocouples TC2526 and TC2525 is slowly increasing with time. | 16B |
| h501 | The differential temperature between the outlet and inlet | 16A |

APPENDIX A -continued

| Hypothesis Number | Brief Explanation | FIG. in Which First Derived |
|---|---|---|
| | cooling water to cooler 54h as measured by thermocouples TC2526 and TC2525 is rapidly increasing with time. | |
| h502 | The purity of the hydrogen within the generator housing is low. | 14 |
| h503 | There is high humidity within the generator housing. | 14 |
| h504 | There is an oil leak at the exciter end or turbine end of the generator. | 14 |
| h505 | Oil has entered the generator housing but the oil is not hot. | 14 |
| h506 | There is disagreement between the exciter and turbine end pressure sensors ASOEXD and ASOTXD however the sensed pressure compared with the hydrogen pressure is approximately 8 psi. | 8A |
| h509 | The rate of change of the turbine end differential pressure is decreasing. | 12 |
| h510 | The rate of change of the differential pressure as measured by sensor ASOHXD is negative. | 11 |
| h512 | The maximum differential pressure measured by either ASOEXD or ASOTXD is approximately 8 psi. | 12 |
| h513 | The differential pressure across the hydrogen side filter 58h is approximately 0 as measured by sensor HSOFXD. | 7A |
| h518 | A disagreement exists since the differential pressure across the hydrogen side filter 58h and the hydrogen side cooler water differential temperature indicates a condition opposite to that indicated by sensor HS063 across hydrogen side pump 50h. | 7A |
| h520 | A problem exists in the exciter end according to gauges ga4610 and ga4630. | 7B |
| h522 | There is agreement between the exciter and turbine end pressure sensors ASOEXD and ASOTXD however the sensed pressure compared with the hydrogen pressure is approximately 8 psi. | 8A |
| h523 | A disagreement exists because pressure conditions as measured by the exciter and turbine end sensors ASOEXD and ASOTXD indicate a contrary condition of the air side pump 50a as indicated by sensor AS063. | 8A |
| h526 | The oil level in the exciter end defoaming tank is high and the oil is hot. | 10 |
| h527 | The oil level in the turbine end defoaming tank 60t is high and the oil is hot. | 10 |
| h531 | The differential pressure as measured by sensor ASOHXD is less than 5 psi. | 11 |
| h535 | The differential pressure derived from the exciter end oil pressure sensor ASOEXD and a hydrogen pressure transducer is approximately 8 psi. | 12 |
| h536 | The differential pressure derived from the exciter end oil pressure sensor ASOEXD and a hydrogen pressure transducer is between 0 and 5 psi. | 12 |
| h540 | The differential pressure derived from the turbine end oil pressure sensor ASOTXD and a hydrogen pressure transducer is approximately 12 psi. | 12 |
| h541 | The differential pressure derived from the turbine end oil pressure sensor ASOTXD and a hydrogen pressure transducer is between 8 and 12 psi. | 12 |
| h542 | The differential pressure derived from the turbine end oil pressure sensor ASOTXD and a hydrogen pressure transducer is approximately 8 psi. | 12 |
| h543 | The differential pressure derived from the turbine end oil pressure sensor ASOTXD and a hydrogen pressure transducer is between 5 and 8 psi. | 12 |
| h549 | The differential pressure at the exciter end is less than 12 psi. | 13 |
| h550e | The differential pressure at the exciter end is less than 8 psi. | 13 |
| h560 | The hydrogen side oil is hot according to thermometer tm520. | 15A |
| h563 | The flow of water to the hydrogen side of the cooler 54h has been increased. | 16B |
| h564 | The differential pressure gauge ga4610 at the exciter end does not read zero. | 17 |
| h565 | The differential pressure gauge ga4630 at the turbine end does not read zero. | 17 |
| h566 | Either the drain valve 231 is open and feed valve 232 is closed or vise versa. | 17 |
| h567 | The hydrogen side pump 50h is off according to gauge readings. | 7B |
| h568 | The difference between the air side oil and hydrogen pressure is less than 8 psi. | 8A |
| h569 | The air side pump 50a is off according to sensor AS063. | 8A |
| h570 | The oil leVel in both the exciter and turbine end defoaming tanks 60e and 60t is high according to sensors DTE71 and DTT71. | 10 |
| h575 | One or more defective valves of the group including drain and feed valves 231 and 232 and pressure regulating valves 210 and 217 is known. | 17 |
| h576 | The difference in temperature between the outlet and inlet cooling water for cooler 54h as measured by thermocouples TC2526 and TC2525 is low. | 16B |

We claim:

1. Diagnostic apparatus for a gas-cooled electric generator seal oil system having a plurality of components and wherein the generator includes a shaft which is sealed against escape of gas used for the gas-cooling, by means of spaced-apart gland seals and wherein sealing oil is supplied to the gland seals, comprising:

(A) a plurality of sensors connected to various ones of said components of said seal oil system and operable to provide respective output signals, each indicative of the on-line operating condition of an associated component;
(B) diagnostic computer means responsive to said output signals and operable to provide an output indication indicative of an abnormal condition relative to a particular component based upon the output signal of the sensor directly associated with said particular component as well as at least one output signal of a sensor not directly associated with said particular component.

2. Apparatus according to claim 1 wherein:
(A) said plurality includes more than three sensors;
(B) said diagnostic computer means utilizes the output indications of at least three of said sensors to confirm the existence of very low seal oil pressure.

3. Apparatus according to claim 1 wherein:
(A) said diagnostic computer means is additionally operable to determine if selected ones of said sensors are in proper operating condition.

4. Diagnostic apparatus for a seal oil system associated with a gas-cooled electric generator having a shaft, and which includes spaced-apart gland seals around the generator shaft to prevent escape of gas used for the gas-cooling, and which includes means for supplying sealing oil to, and recovering sealing oil from, the seals, comprising:
(A) sensor means connected to sense predetermined operating parameters of said seal oil system while on-line and to provide corresponding parameter indicative signals;
(B) diagnostic computer means responsive to said parameter indicative signals and operable to provide indications of the existence of possible abnormal operating conditions of said seal oil system as well as an indication of the probable cause of at least one of said abnormal conditions.

5. Diagnostic apparatus for a seal oil system associated with a gas-cooled electric generator having a shaft, and which includes spaced-apart gland seals around the generator shaft to prevent escape of gas used for the gas-cooling, and which includes means for supplying sealing oil to, and recovering sealing oil from, the seals, comprising:
(A) sensor means operable to provide an indication of predetermined pressure relationships between the pressure of the oil in said seal oil system, and the pressure of the gas within said gas-cooled generator;
(B) diagnostic computer means responsive to said sensor means indication and operable to categorize the differential pressure between the oil in said seal oil system and the gas in said gas-cooled generator into a plurality of different pressure differential ranges;
(C) said diagnostic computer means being further operable to provide indications of possible abnormal operating conditions of said seal oil system, utilizing the existence of a differential pressure within at least one of said ranges.

6. Apparatus according to claim 5 wherein:
(A) said sensor means includes a single sensor connected to sense the pressure of the oil in said seal oil system and the pressure of the gas within said gas-cooled generator, and provide, in response thereto, a unitary differential pressure output signal.

7. Apparatus according to claim 5 wherein:
(A) said sensor means includes first and second sensors connected to sense the respective seal oil pressures at said spaced apart gland seals; and which further includes,
(B) a third sensor positioned to provide an indication of the gas pressure within said gas-cooled generator.

8. Apparatus according to claim 7 wherein:
(A) said diagnostic computer means is additionally operable to test whether a predetermined difference is exceeded in the pressure indications provided by said first and second sensors.

9. Apparatus according to claim 5 wherein:
(A) said diagnostic computer means is additionally operable to derive indications of the rate of change of said differential pressure and to utilize said derived rate of change in its diagnostic process.

10. Diagnostic apparatus for a multi-component gas-cooled electric generator seal oil system wherein the generator includes a shaft which is sealed against escape of gas used for the gas-cooling by means of spaced-apart gland seals and wherein sealing oil is supplied to the gland seals, comprising:
(A) a plurality of sensors connected to sense predetermined operating parameters of said seal oil system, while on-line, and to provide respective corresponding output signals;
(B) diagnostic computer means including a memory into which is stored a rule base for diagnosing the on-line operating condition of said seal oil system;
(C) said rule base including a plurality of evidence nodes and consequent hypothesis nodes as well as rules linking a preceding evidence node with a consequent hypothesis node;
(D) a predetermined number of said plurality of evidence nodes constituting sensor nodes;
(E) means for inputting said on-line sensor signals into said sensor nodes;
(F) means for additionally inputting operator generated values into selected ones of said sensor nodes.

11. Apparatus according to claim 10 which includes:
(A) at least one thermometer connected to provide a reading of seal oil temperature;
(B) at least one of said operator generated values is the temperature reading of said thermometer.

12. Apparatus according to claim 10 which includes:
(A) at least one pressure gauge connected to provide a reading of seal oil pressure;
(B) at least one of said operator generated values is the pressure reading of said pressure gauge.

13. Diagnostic apparatus for a seal oil system associated with a gas-cooled electric generator having a shaft and including spaced apart gland seals around the shaft and wherein oil for sealing against cooling gas leakage is supplied by a pump in an air side system to an outer circumferential groove and by a pump in a gas side system to an inner circumferential groove in the gland seals, and returned to said pumps via respective fluid paths, the fluid path in said gas side system including a regulator tank, comprising:
(A) a first plurality of sensors connected to sense predetermined operating parameters associated with said air side system and provide corresponding output signals;
(B) a second plurality of sensors connected to sense predetermined operating parameters associated with said gas side system and provide corresponding output signals;

(C) diagnostic computer means responsive to said output signals and operable to provide an indication of an abnormal operating condition associated with said seal oil system utilizing both (a) output signals of said sensors associated with said air side system as well as (b) output signals associated with said gas side system.

14. Apparatus according to claim 13 wherein:
(A) said diagnostic computer means utilizes the output indications of at least three of said sensors to confirm the existence of loss of pump action on said gas side system.

15. Apparatus according to claim 13 wherein:
(A) said diagnostic computer means utilizes the output indications of at least three of said sensors to confirm the existence of loss of pump action on said air side system.

16. Diagnostic apparatus for a seal oil system associated with a gas-cooled electric generator having a shaft and including first and second spaced apart gland seals around the shaft and wherein oil for sealing against cooling gas leakage is supplied by a pump in an air side system to an outer circumferential groove and by a pump in a gas side system to an inner circumferential groove in the gland seals, and returned to said pumps via respective fluid paths, the fluid path in said gas side system including a regulator tank, comprising:
(A) sensor means connected to sense predetermined operating parameters associated with one of said spaced apart gland seals and provide corresponding output signals;
(B) sensor means connected to sense predetermined operating parameters associated with the other of said spaced apart gland seals and provide corresponding output signals;
(C) said diagnostic computer means responsive to said output signals and operable to provide an indication of an abnormal operating condition associated with one of said spaced apart gland seals utilizing the output signals of said sensors associated with both said gland seals.

17. Apparatus according to claim 16 wherein:
(A) said oil and gas side systems include oil filters;
(B) said sensor means includes sensors operable to provide output signals indicative of the respective differential pressures across said oil filters;
(C) said diagnostic computer means is additionally responsive to at least one of said oil filter pressure differential indicative signals to provide an indication of an abnormal operating condition associated with at least one of said gland seals.

18. Apparatus according to claim 16 wherein:
(A) said oil and gas side systems include a respective temperature sensor each operable to provide an output signal indicative of oil temperature;
(B) said diagnostic computer means is additionally responsive to at least one of said oil temperature indicative signals to provide an indication of an abnormal operating condition associated with said gland seals.

19. Apparatus according to claim 16 which includes:
(A) first and second spaced apart defoaming tanks which receive oil discharged from respective ones of said inner circumferential grooves of said gland seals, and provide the discharged oil to said regulator tank;
(B) sensor means for providing respective output signals indicative of oil level in said defoaming tanks; and wherein,
(C) said diagnostic computer means is operable to provide an indication of a high defoaming tank oil level together with its probable cause, utilizing said oil level indicative signals as well as said oil temperature indicative signals.

20. Diagnostic apparatus for a seal oil system associated with a gas-cooled electric generator having a shaft and including spaced apart gland seals around the shaft and wherein oil for sealing against cooling gas leakage is supplied by a pump in an air side system to an outer circumferential groove and by a pump in a gas side system to an inner circumferential groove in the gland seals, and returned to said pumps via respective fluid paths, the fluid path in said gas side system including a regulator tank in which said oil from said gas side system accumulates and having an oil line to which is connected a normally closed drain valve which will open to drain oil into said air side system when the oil level in said regulator tank gets too high and another oil line to which is connected a normally closed feed valve which will open to receive oil from said air side system when the oil level in said regulator tank gets too low comprising:
(A) first sensor means operable to provide an indication of the open or closed condition of said drain valve; and
(B) second sensor means operable to provide an indication of the open or closed condition of said feed valve.

21. Apparatus according to claim 20 wherein:
(A) said first and second sensors are connected to the respective oil lines connected to said drain and feed valves.

22. Apparatus according to claim 21 wherein:
(A) said first and second sensors are oil flow sensors.

23. Apparatus according to claim 20 which includes:
(A) first and second spaced apart defoaming tanks which receive oil discharged from respective ones of said inner circumferential groves of said gland seals, and provide the discharged oil to said regulator tank;
(B) third sensor means connected in the oil path from said defoaming tanks to said regulator tank and operable to provide an output signal if said regulator tank backs up to a predetermined level.

24. Diagnostic apparatus for a seal oil system associated with a gas-cooled electric generator having a shaft and including spaced apart gland seals around the shaft and wherein oil for sealing against cooling gas leakage is supplied by a pump in an air side system to an outer circumferential groove and by a pump in a gas side system to an inner circumferential groove in the gland seals, and returned to said pumps via respective fluid paths, the fluid paths in said air and gas side systems including respective oil coolers each having an inlet and outlet for circulation of cooling water, comprising:
(A) temperature sensors for providing output signals indicative of the temperature of said inlet and outlet cooling water;
(B) diagnostic computer means responsive to said output signals and operable to generate indications of high or low inlet cooling water temperature for an oil cooler as well as indications of high, low or approximately zero differential temperature between inlet and outlet cooling water;

(C) temperature sensors for providing output signals indicative of air side and gas side oil temperature;

(D) said diagnostic computer means being additionally responsive to said oil temperature indicative signals to provide indications of possible abnormal operating conditions of said oil coolers.

25. Apparatus according to claim 24 wherein:
(A) said diagnostic computer means is additionally operable to derive indications of the rate of change of said differential temperature.

* * * * *